United States Patent
Park et al.

(10) Patent No.: US 9,846,450 B2
(45) Date of Patent: Dec. 19, 2017

(54) ELECTRONIC DEVICE

(71) Applicant: LG ELECTRONICS INC., Seoul (KR)

(72) Inventors: Sungyong Park, Seoul (KR); Yihyun Moon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/094,838

(22) Filed: Apr. 8, 2016

(65) Prior Publication Data

US 2017/0075380 A1  Mar. 16, 2017

(30) Foreign Application Priority Data

Sep. 11, 2015  (KR) ...................... 10-2015-0128696

(51) Int. Cl.
| | |
|---|---|
| *H05K 5/00* | (2006.01) |
| *G06F 1/16* | (2006.01) |
| *H04M 1/02* | (2006.01) |
| *H05K 5/02* | (2006.01) |
| *H04M 1/23* | (2006.01) |

(52) U.S. Cl.
CPC .......... *G06F 1/1616* (2013.01); *G06F 1/1637* (2013.01); *G06F 1/1662* (2013.01); *G06F 1/1681* (2013.01); *H04M 1/0216* (2013.01); *H04M 1/0266* (2013.01); *H05K 5/0017* (2013.01); *H05K 5/0226* (2013.01); *H04M 1/23* (2013.01)

(58) Field of Classification Search
CPC ............ H04M 1/0216; H04M 1/0266; H05K 5/0017; H05K 5/0226; G06F 1/1616; G06F 1/1601; G06F 1/1637; G06F 1/1662
USPC .......................................................... 361/755
See application file for complete search history.

(56) References Cited

U.S. PATENT DOCUMENTS

| | | | | |
|---|---|---|---|---|
| D532,008 S | * | 11/2006 | Solomon et al. ............ | D14/327 |
| D610,581 S | * | 2/2010 | Prokop ........................ | D14/315 |
| D626,961 S | * | 11/2010 | Prokop ........................ | D14/393 |
| 8,861,212 B2 | * | 10/2014 | Li et al. ................ | G06F 1/1637 361/728 |
| 9,137,907 B2 | * | 9/2015 | Sun ....................... | H05K 5/0017 |
| D771,032 S | * | 11/2016 | Browning et al. ........... | D14/316 |

(Continued)

FOREIGN PATENT DOCUMENTS

| | | |
|---|---|---|
| JP | 9-54633 A | 2/1997 |
| KR | 10-1998-027418 A | 7/1998 |

(Continued)

OTHER PUBLICATIONS

Wconeybeer, "Arc unveils curved Nalu laptop concept design", www.myce.com, Jul. 16, 2010, 1 page.

(Continued)

*Primary Examiner* — Hung S Bui
(74) *Attorney, Agent, or Firm* — Birch, Stewart, Kolasch & Birch, LLP

(57) ABSTRACT

An electronic device having a display including a curved display panel, a curved body, the curved body having an input unit at curved surface of the curved body, the curved surface of the curved body corresponding to a curvature of the curved display panel and a hinge connecting the display to the curved body is provided.

20 Claims, 40 Drawing Sheets

(56) References Cited

U.S. PATENT DOCUMENTS

2004/0228081 A1* 11/2004 Lee ................... G06F 1/162
　　　　　　　　　　　　　　　　　　361/679.06
2011/0199718 A1* 8/2011 Stone et al. .......... G06F 1/1618
　　　　　　　　　　　　　　　　　　361/679.01
2011/0315317 A1 12/2011 Ling et al.

FOREIGN PATENT DOCUMENTS

KR　10-2000-0021839 A　4/2000
KR　10-2011-0049546 A　5/2011

OTHER PUBLICATIONS

"Lenovo ideapad Y700," retrieved from URL:http://files.voelkner.de/1400000-1499999/001403758-an-01-de-LENOVO_Y700_15ISK_NOTEBOOK.pdf, Aug. 31, 2015, pp. 1-32 (39 pages total).
Smith, "Curved Notebook Concept Adds Ergonomic Keyboard and IMAX-like Screen(Video)," retrieved from URL:http://notebooks.com/2010/07/13/curved-notebook-concept-adds-ergonomic-keyboard-and-more-video/, Jul. 13, 2010, pp. 1-5.

* cited by examiner

FIG. 2
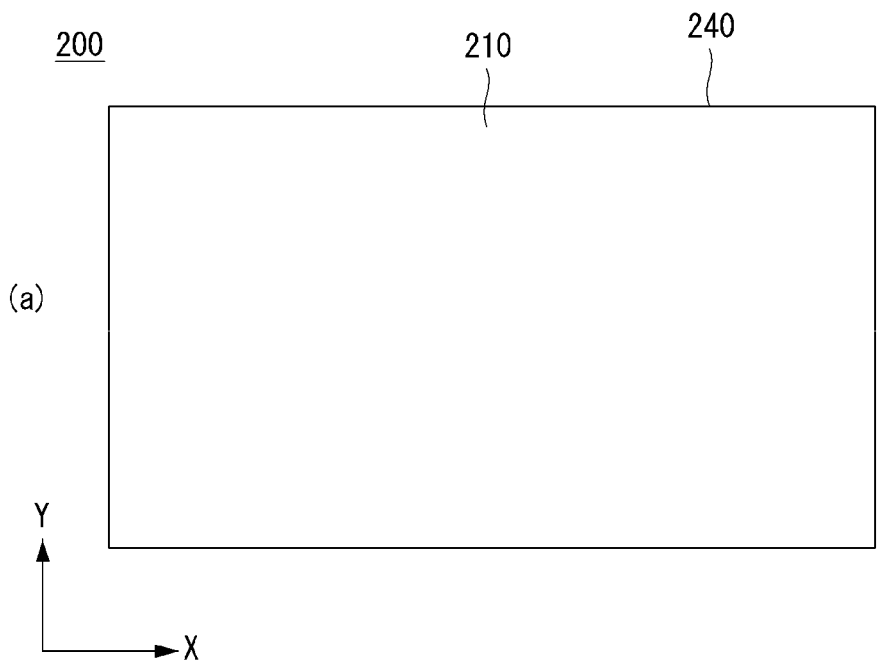
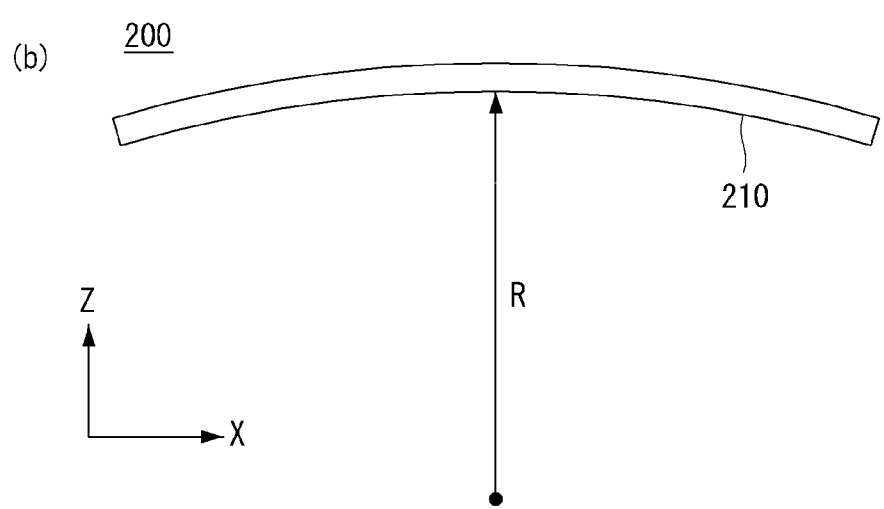

FIG. 11
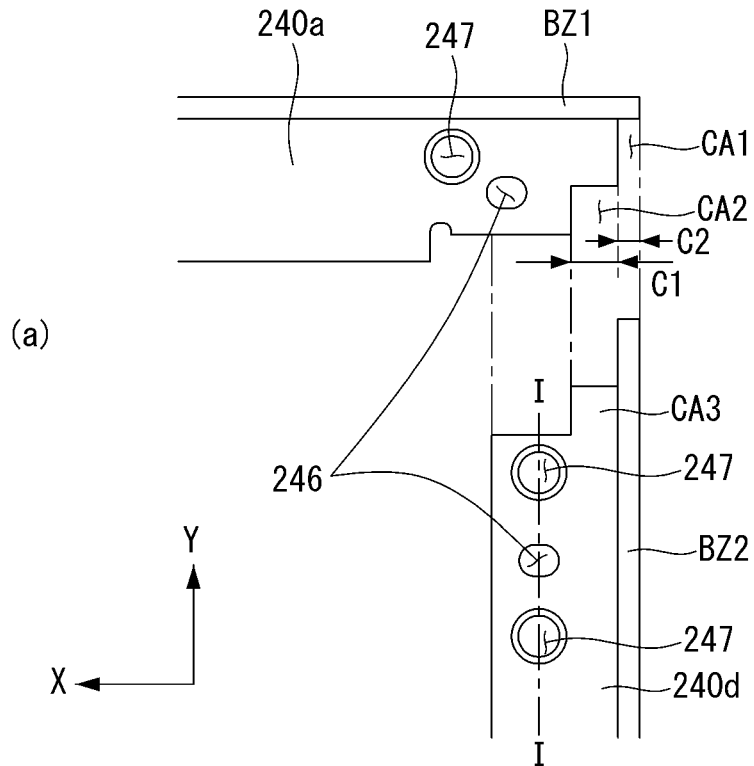
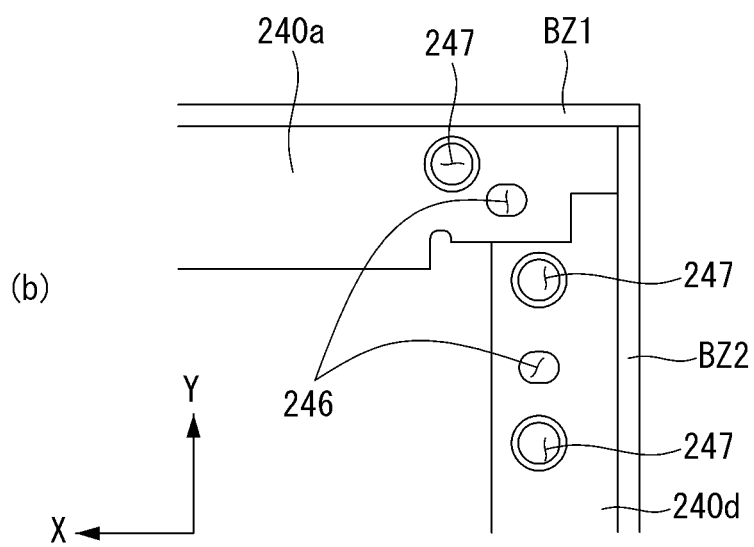

ELECTRONIC DEVICE

This application claims the benefit of Korean Patent Application No. 10-2015-0128696 filed on Sep. 11, 2015, the entire contents of which are incorporated herein by reference for all purposes as if fully set forth herein.

BACKGROUND OF THE INVENTION

Field of the Invention

The present invention relates generally to electronic devices and, more particularly, to electronic devices with curved displays.

Discussion of the Related Art

As TVs, personal computers, laptop computers, mobile phones, tap books, and other electronic devices are provided with increasing numbers of functions, they are being implemented as multimedia devices having multiple functions including, e.g., image and video capturing, playback of music or video files, gaming, and broadcast reception.

Curved displays are recently in development that may offer users enhanced concentration. A curved display has a predetermined degree of curvature. Accordingly, curved displays entail the development of a new concept of devices different from those electronic devices with flat displays.

SUMMARY OF THE INVENTION

To achieve the foregoing or other objects, according to an aspect of the present invention, there is provided an electronic device comprising a hinge; a display unit including a curved display panel and connected to a side of the hinge; and a curved body including a system, having an input unit at an outside, connected to another side of the hinge, and corresponding to a curvature of the curved display panel.

According to another aspect of the present invention, the input unit may be a curved keypad having a curvature corresponding to the curved display panel.

According to another aspect of the present invention, the display panel may have a front surface internally curved, and the body may have a front surface externally curved.

According to another aspect of the present invention, the display panel may be internally curved in a left or right direction, and the body may be externally curved in a left or right direction.

According to another aspect of the present invention, the body may have a front surface externally curved, and the input unit may be positioned in the front surface of the body.

According to another aspect of the present invention, the body may have a front surface externally curved, the front surface of the body having a depression internally curved, and the input unit may be positioned at the depression.

According to another aspect of the present invention, an edge of the body or the display unit connected to the hinge may have a curved part externally curved.

According to another aspect of the present invention, an edge of the body or the display unit connected to the hinge may include a plurality of straight parts to be overall externally curved.

According to another aspect of the present invention, the display unit may have a curved rear surface, and the body may have a flat rear surface.

According to another aspect of the present invention, the display unit may include a first long side, a second long side positioned parallel with and opposite the first long side, a first short side positioned at an end of the first long side and an end of the second long side, and a second short side positioned parallel with and opposite the first short side at another end of the first long side and another end of the second long side, the body may include a first long side, a second long side positioned parallel with and opposite the first long side, a first short side positioned at an end of the first long side and an end of the second long side, and a second short side positioned parallel with and opposite the first short side at another end of the first long side and another end of the second long side, a front surface of the display panel may be internally curved along a direction from the first short side to the second short side, and a front surface of the body may be externally curved along a direction from the first short side to the second short side.

According to another aspect of the present invention, the hinge may be positioned adjacent to the first long side of the body and the first long side of the display unit to connect the body with the display unit.

According to another aspect of the present invention, the display unit may include a curved plate, a curved display panel positioned in front of a concave surface of the curved plate, a curved module cover positioned in front of a convex surface of the curved plate, and a rigid bar coupled to the curved module cover.

According to another aspect of the present invention, a side of the hinge may be coupled to the rigid bar.

According to another aspect of the present invention, the hinge may include a rotating part including a hinge shaft, an extension part extending from the rotating part, and a fixing part extending from the extension part to cross a direction of extension of the extension part, and the fixing part may be coupled or fitted to the rigid bar.

According to another aspect of the present invention, the rigid bar may be fastened to the module cover by a coupling member, and the fixing part may be fastened to the rigid bar by a coupling member.

According to another aspect of the present invention, the electronic device may further comprise a frame positioned in a rear of the module cover, wherein the module cover is positioned between the plate and the frame, and wherein the rigid bar may be coupled to the frame.

According to an embodiment of the present invention, there may be provided an electronic device proper for a curved display.

According to an embodiment of the present invention, there may be provided an electronic device having a curved body.

According to an embodiment of the present invention, there may be provided an electronic device having an ergonomic input device.

According to an embodiment of the present invention, there may be provided a rotating structure appropriate for a curved electronic device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 2 is a view illustrating an example of a display device according to an embodiment of the present invention.

FIGS. 10 to 13 are views illustrating examples of combining a frame according to embodiments of the present invention.

DETAILED DESCRIPTION OF THE EMBODIMENTS

Figure 1:
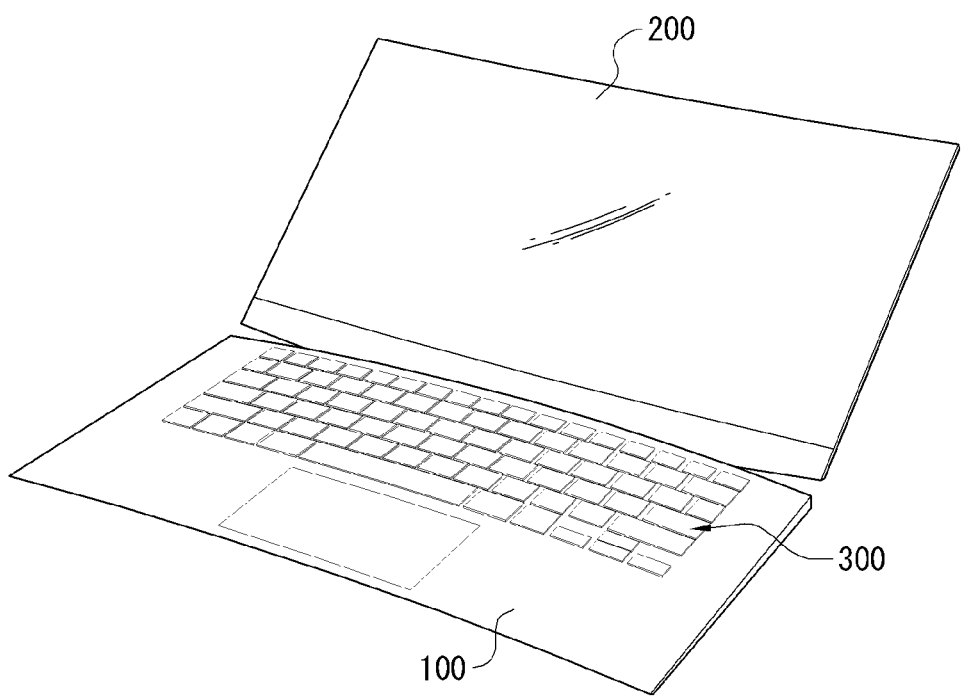
FIG. 1 is a view illustrating an example of an electronic device according to an embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Although organic light emitting displays (OLEDs) are described as possible display panels in the description below, it is understood that display panels applicable to the present invention are not limited thereto.

In the description that follows the display panel described below may include a first long side LS1, a second long side LS2 positioned opposite the first long side LS1, a first short side SS1 abutting the first long side LS1 and the second long side LS2, and a second short side SS2 positioned opposite the first short side SS1.

Here, the first short side SS1 may be referred to as a first side area, the second short side SS2 as a second side area positioned opposite the first side area, the first long side LS1 as a third side area that abuts the first side area and the second side area and is positioned between the first side area and the second side area, and the second long side LS2 as a fourth side area that abuts the first side area and the second side area and is positioned between the first side area and the second side area and opposite the third side area.

Further, for ease of description, although the first and second long sides LS1 and LS2 are longer than the first and second short sides SS1 and SS2, the first and second long sides LS1 and LS2 may be substantially the same in length as the first and second short sides SS1 and SS2.

Further, a first direction DR1 may be a direction parallel with the long sides LS1 and LS2 of the display panel, and a second direction DR2 may be a direction parallel with the short sides SS1 and SS2 of the display panel.

A third direction DR3 may be a direction perpendicular to the first direction DR1 and/or the second direction DR2.

The first direction DR1 and the second direction DR2 may collectively be referred to as a horizontal direction.

The third direction DR3 may be referred to as a vertical direction.

FIG. 1 is a view illustrating an example of an electronic device according to an embodiment of the present invention. FIG. 1 shows a body 100, a display device 200, and an input device 300. The display device 200 may be referred to as a display unit, display, or a display part. The input device 300 may be referred to as an input means, input unit, or input part.

The body 100 may include a system for operation or control of the electronic device. The system may be configured inside the body 100. The system may be an electronic computation device, such as, a PC but is not limited thereto.

The display device 200 may be curved to have a predetermined curvature. The predetermined curvature may be one for allowing the user to be more concentrated. The display device may include a display panel 210 provided in the display device 200 and arranged to externally display information.

FIG. 2 is a view illustrating an example of a display device according to an embodiment of the present invention. As shown in FIG. 2(b), the display device 200, according to an embodiment of the present invention, may be configured to have a curvature R. As shown in FIG. 2(a), at front view, the display device 200 may be shaped as a quadrilateral such as a rectangle. As viewed from the front, the front surface of the display panel 210 constituting the display device 200 may be viewed.

A frame 240 may be shaped to surround the outside of the display panel 210. Part of the frame 240 may be externally exposed and may function as a bezel. However, no frame 240 may be provided or the frame 240 may be positioned inside so as not provide a bezel.

As shown in FIG. 2(b), when looking down from the top, the display device 200 may have a curvature R. For example, that means that a component of the display device 200 including the display panel 210 may be configured to have a shape with a predetermined curvature. The curvature of the display device 200 allows the user to be more concentrated when viewing the display device 200.

Figure 3:
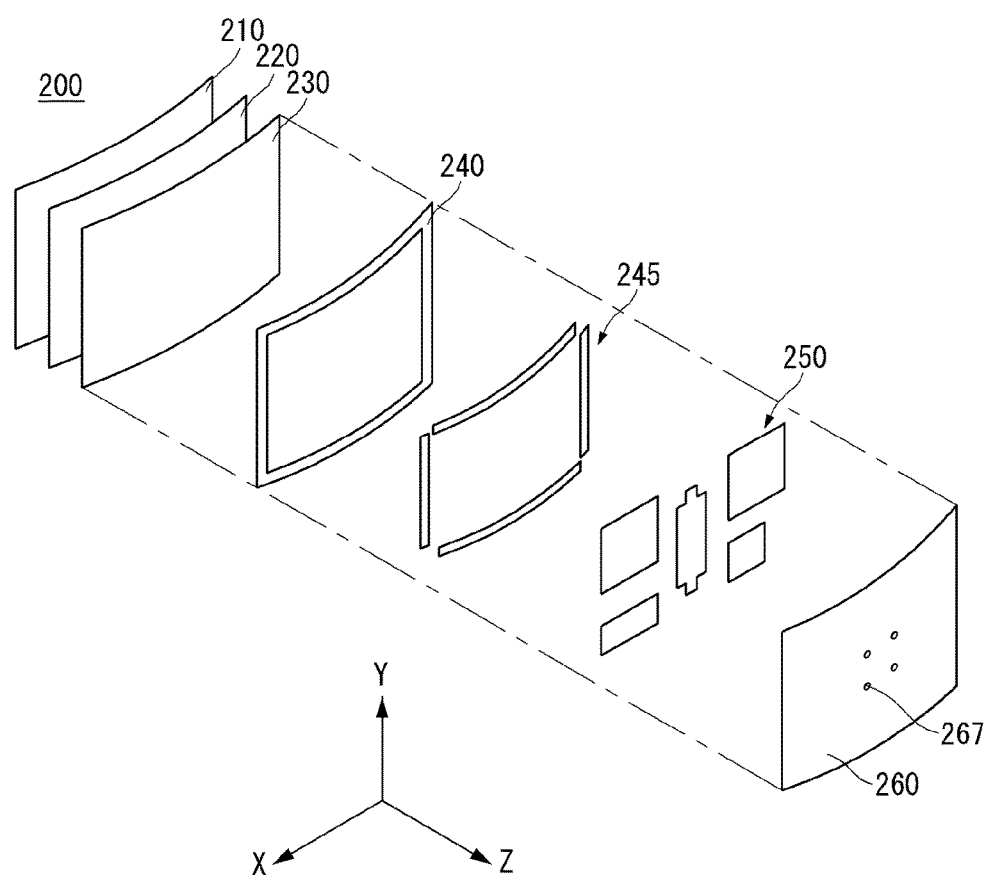
FIG. 3 is an exploded view illustrating the display device of FIG. 2.

FIG. 3 is an exploded view illustrating the display device of FIG. 2. As shown in FIG. 3, the display device 200, according to an embodiment of the present invention, may include a display panel 210, a plate 220, a module cover 230, a frame 240, one or more rigid bars 245, and a back cover 260. These components may be shaped to match the predetermined curvature as described above. That is, the display panel 210, plate 220, module cover 230, frame 240, rigid bars 245, and back cover 260 may all be curved.

The display panel 210 may include a plurality of layers. For example, the display panel 210 may include a front substrate, a rear substrate, and/or an optical layer. The display panel 210 may be a self-emissive OLED panel. The OLED panel may not require a separate illumination to display images. Accordingly, it may be implemented to be relatively thinner and to have a curved structure. For example, the display panel 210 may be implemented to be curved so as to have a single or multiple curvatures.

The plate 220 may be attached to the rear surface of the display panel 210. The plate 220 and the display panel 210 may be attached together by way of an adhesive tape.

The plate 220 may be formed of aluminum. The aluminum plate 220 may scatter heat transferred from the display panel 210. Accordingly, it may stop heat from concentrating on a particular area of the display panel 220, preventing the display panel 210 from deforming.

The module cover 230 may be attached to the plate 220. The module cover 230 and the plate 220 may be attached together by way of an adhesive tape. Accordingly, the display panel 210 may be attached to a surface of the plate 220, and the module cover 230 may be attached to the other side of the plate 220. The module cover 230 may have a preformed area sot that a predetermined portion of the module cover 230 has a step with respect to the remaining portion of the module cover. For example, protrusions and depressions may be formed in the preformed area by a pressing process. The preformed area may play a role to reduce heat directly transferred to the display panel 210.

An electronic part 250 may be coupled to the module cover 230. The electronic part 250 may generate control signals necessary for the operation of the display device 200 including the display panel 210.

The frame 240 may be coupled to the display panel 210 and the module cover 230 attached with the plate 220 positioned therebetween. The frame 240 may be formed of a material with a predetermined level or more of rigidity to provide rigidity to the display device 200.

The rigid bars(s) 245 may be coupled to a rear surface of the module cover 230. The rigid bar(s) 245 attached to the module cover 230 may provide rigidity to the display device 200. In particular, since the display device 200 is relatively thin it may be vulnerable to external force and, by providing the rigid bar(s) attached to the module cover 230 in a horizontal and/or vertical direction, they may prevent the module cover 230 from twisting.

The back cover 260 shields the rear surface of the display device 200. The back cover 260 may be coupled to the frame 240.

Figure 4:
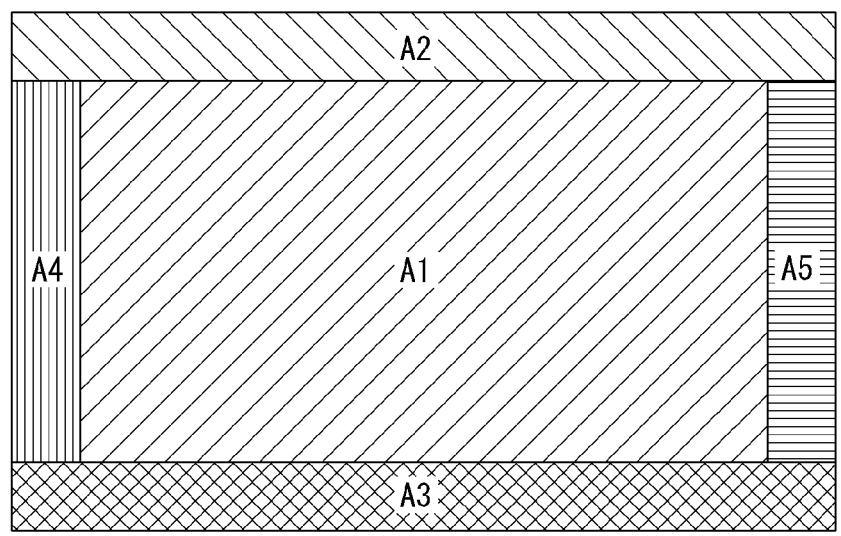
FIG. 4 is a view illustrating an example of a position of a rigid bar according to an embodiment of the present invention.

FIG. 4 is a view illustrating an example of positions for a rigid bar according to an embodiment of the present invention. The rigid bar(s) 245 may be attached to a particular coupling region of the module cover 230. A first area A1 may be a center area of the module cover 230. The electronic part 250 may be coupled to the first area A1. Accordingly, the rigid bar(s) 245 may be coupled to the other area than the first area A1, such as the second to fifth areas A2, A3, A4 and A5.

Figure 5:
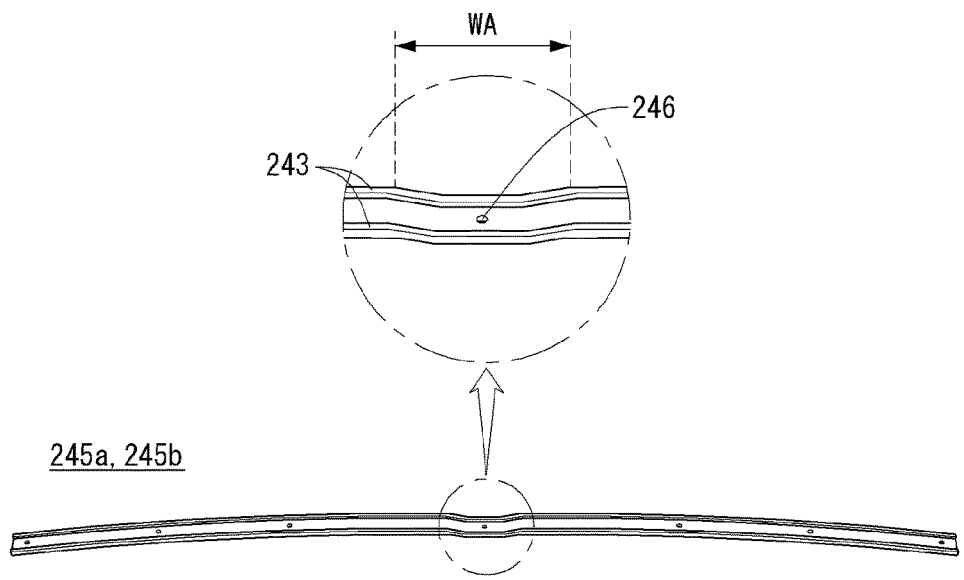
FIG. 5 is a view illustrating an example of a rigid bar according to an embodiment of the present invention.

FIG. 5 is a view illustrating an example of a rigid bar according to an embodiment of the present invention. First and second rigid bars 245a and 245b may have a curvature including a curvature that matches the curvature of the display panel. When the first and second rigid bars 245a and 245b are attached in a horizontal direction, depending on the shape of the display device 200, they may have a curvature. The first and second rigid bars 245a and 245b may differ in shape from third and fourth rigid bars 245c and 245d attached in a vertical direction of the display device 200. For example, while the first and second rigid bars 245a and 245b may have a curvature, the vertical-directional third and fourth rigid bars 245c and 245d might not have a curvature.

The center area WA of the first and second rigid bars 245a and 245b may have a different shape from the remaining areas of the first and second rigid bars 245a and 245b. For example, the center area WA might not have a reinforcing rib 243 unlike the other area. Further, coupling holes 246 may be formed at predetermined intervals in the area including the center area WA.

Figure 6:
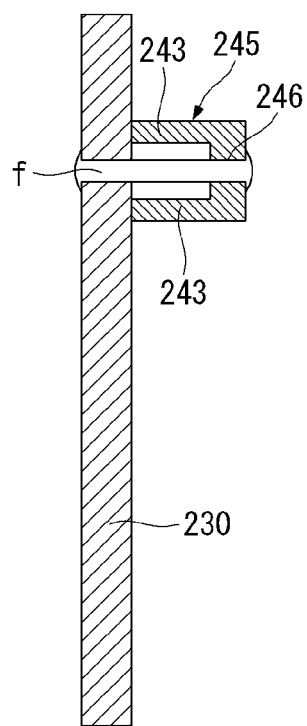
FIGS. 6 to 9 are views illustrating examples of combining a rigid bar according to embodiments of the present invention.

FIGS. 6 to 9 are views illustrating examples of connecting a rigid bar to the display device according to embodiments of the present invention. Referring to FIG. 6, the rigid bar 245 may be coupled to the module cover 230. In this case, the reinforcing rib 243 may support the rigid bar 245 while contacting a surface of the module cover 230. A plurality of reinforcing ribs 243 may contact a surface of the module cover 230. The coupling hole 246 may be formed in the rigid bar 245 in the area other than the area where the reinforcing rib 243 is provided. When a plurality of reinforcing ribs 243 contact a surface of the module cover 230 to support the rigid bar 245, the coupling hole 246 may face a surface of the module cover 230. In this case, a coupling member f may couple the rigid bar 245 with the module cover 230 through the coupling hole 246. Accordingly, the rigid bar 245 may be coupled to the module cover 230 while minimizing the contact between the rigid bar 245 and the module cover 230. The coupling member f may be, e.g., a rivet, bolt and nut or a synthetic resin with high intensity and adhesivity.

Figure 7:
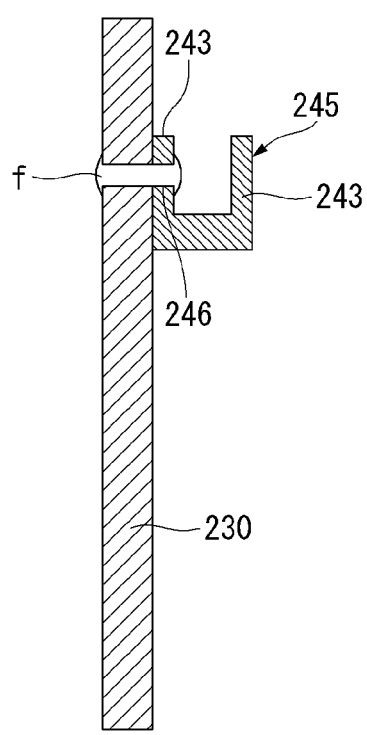
Figure 9:
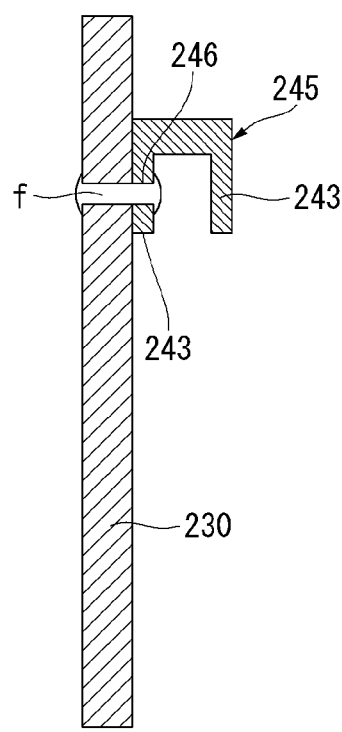
Figure 10:
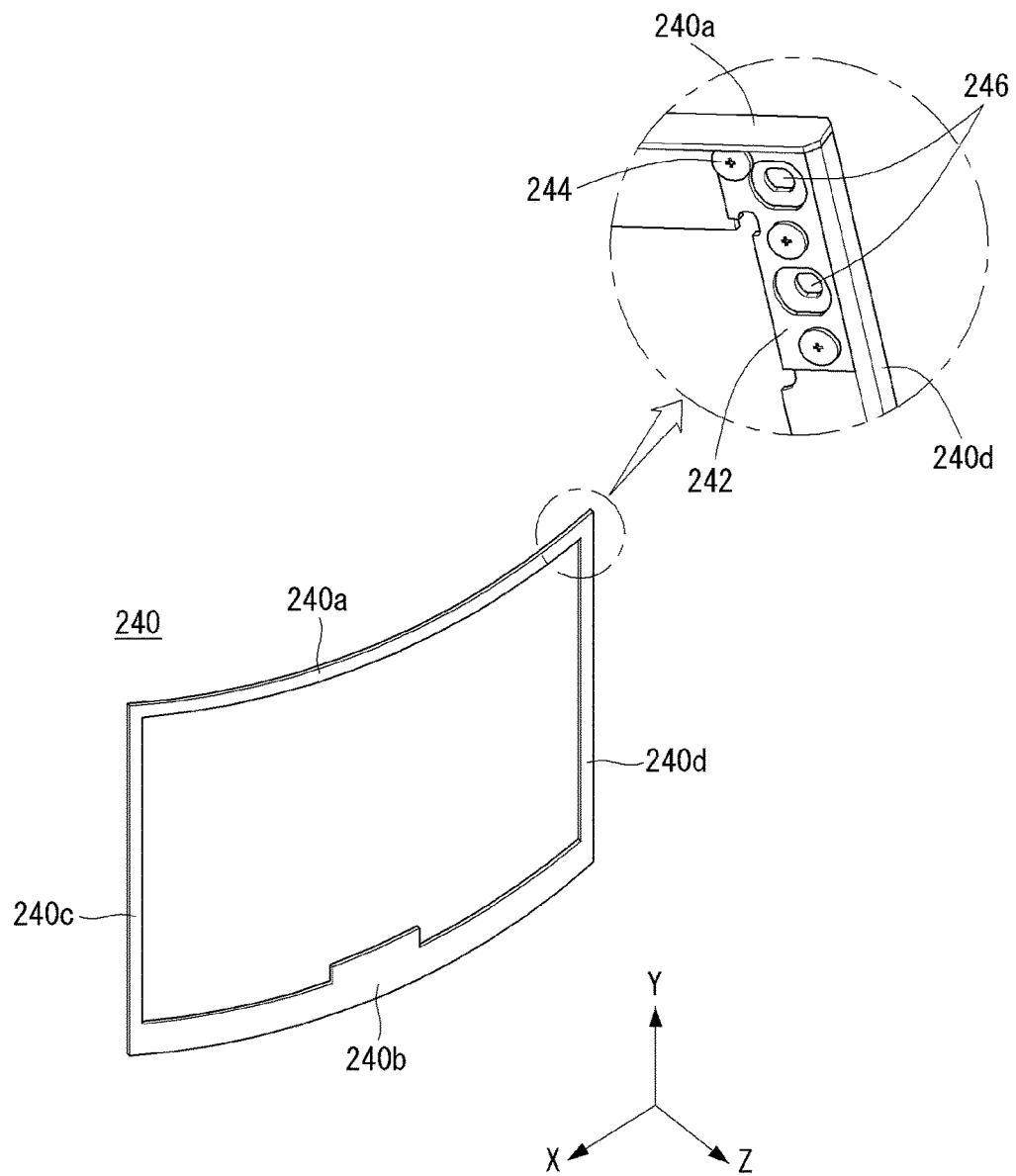

Referring to FIG. 7, the rigid bar 245 may be coupled to the module cover 230. In this case, a side surface of one of the reinforcing ribs contacts a surface of the module cover 230. A plurality of reinforcing ribs 243 may be provided in the rigid bar 245. As any one of the plurality of reinforcing ribs 243 contacts a surface of the module cover 230, the rigid bar 245 may be supported. The coupling hole 246 may be formed in the reinforcing rib 243 that contacts a surface of the module cover 230. The direction in which the rigid bar 245 is coupled may be varied as shown in FIG. 9. When any one of the plurality of reinforcing ribs 243 contacts the module cover 230, the coupling hole 246 formed therein may be positioned opposite the module cover 230. The coupling member f may couple the rigid bar 245 to the module cover 230 through the coupling hole 246.

Figure 8:
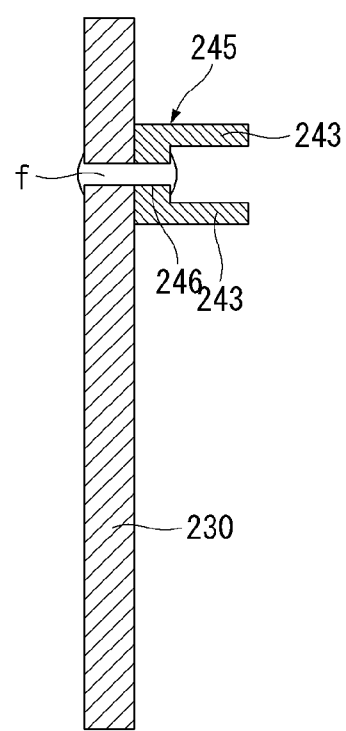

Referring to FIG. 8, the rigid bar 245 may be coupled to the module cover 230. In this case, the reinforcing rib 243 might not contact a surface of the module cover 230. The coupling hole 246 may be formed in the rigid bar 245 in an area other than the reinforcing rib 243, such as a base of the rigid bar 245. The coupling hole 246 may be positioned opposite a surface of the module cover 230. In this case, a coupling member f may couple the rigid bar 245 with the module cover 230 through the coupling hole 246.

FIGS. 10 to 13 are views illustrating examples of combining a frame according to embodiments of the present invention. As shown in FIGS. 10 to 13, the display device 200 according to an embodiment of the present invention may include a frame 240.

The frame 240 may be a part to which a component of the display device 200 is coupled. The frame 240 may provide rigidity to the display device 200. The frame 240 may be formed by assembling a plurality of separate parts. For example, the frame 240 may be configured in such a manner that first to fourth frame portions 240*a*, 240*d*, 240*b* and 240*c* are assembled.

Further, a fixer 242 may be used to effectively assemble the first to fourth frames 240*a* 240*d*, 240*b*, and 240*c* together. The fixer 242 may correspond to the shape of an edge of the assembled frame 240. The fixer 242 may be coupled by overlapping an edge of the frame 240.

The frame 240 may have a relatively small thickness. That is, the frame thickness (T1 of FIG. 12) of the frame 240 may be configured to be within a few millimeters to reduce the overall thickness of the display device 200.

Because the frame 240 is relatively thin, the coupling between the first to fourth frames 240*a* 240*d*, 240*b*, and 240*c* may be difficult to achieve. For example, when a screw 244 is used for fastening the frame 240, it is desirable for the frame to not have a thickness that is much greater than the minimum thickness for coupling the screw 244; however, because of the minimal thickness, the screw 244 may be easily loosen. According to an embodiment of the present invention, in the display device 200, a coupling member 248 (see FIG. 12) may be added to the frame 240 to secure a coupling force of the screw 244.

As shown in FIGS. 11(*a*) and (*b*), the first and second frames 240*a* and 240*d* may have respective ends with corresponding shapes to engage each other. For example, the first frame 240*a* may have a first engaging space CA1 and a second engaging space CA2. The width of the first engaging space CA1 may be C2, and the width of the second engaging space CA2 may be C1. The first frame 240*a* may include a bezel part BZ1.

A second bezel part BZ2 of the second frame 240*d* may have a shape corresponding to the first engaging space CA1 such that the thickness of the second bezel part BZ2 may be C2. A cooperating part CA3 of the second frame 240*d* may correspond to the first engaging space CA1 of the first frame 240*a*. When the first and second frames 240*a* and 240*d* are coupled with each other, the bezel BZ2 and first engaging space CA1 and the cooperating part CA3 and second engaging space CA2 may be brought in tight contact with each other.

Figure 12:
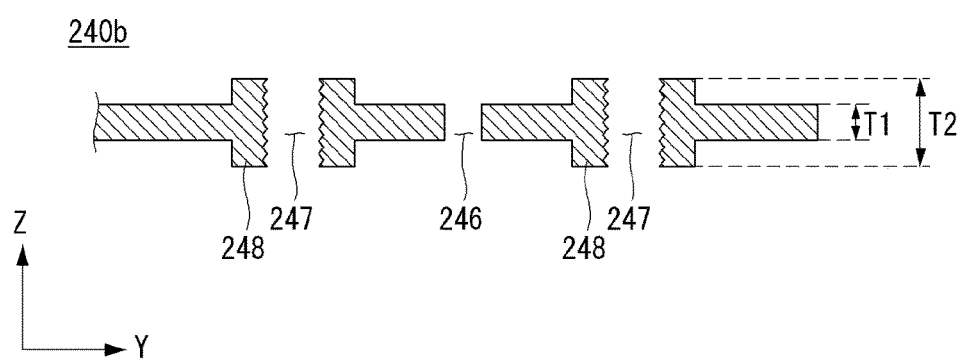

As shown in FIG. 12, the frame 240 may include a first coupling hole 247 to which the coupling member 248 is coupled and a second coupling hole 246 with no coupling member 248 coupled thereto. For example, that means that the coupling member 248 may be press-fitted into the first coupling hole 247.

The height T2 of the first coupling hole 247 may be more than the height T1 of the second coupling hole 246. As such, the first coupling hole 247 may be formed to be taller by the presence of the coupling member 248 inserted in the first coupling hole 247. As the first coupling hole 247 is configured with the height T2, the screw 244 to be coupled into the first coupling hole 247 may be more securely coupled to the first coupling hole 247 whereby the length of the coupling of the screw 244 to the frame 240 may be increased. The increased length of coupling of the screw 244 enables a stable coupling. The overall height of the frame 240, however, is not increased, and thus, the overall increase in weight and/or thickness may be minimized.

Figure 13:
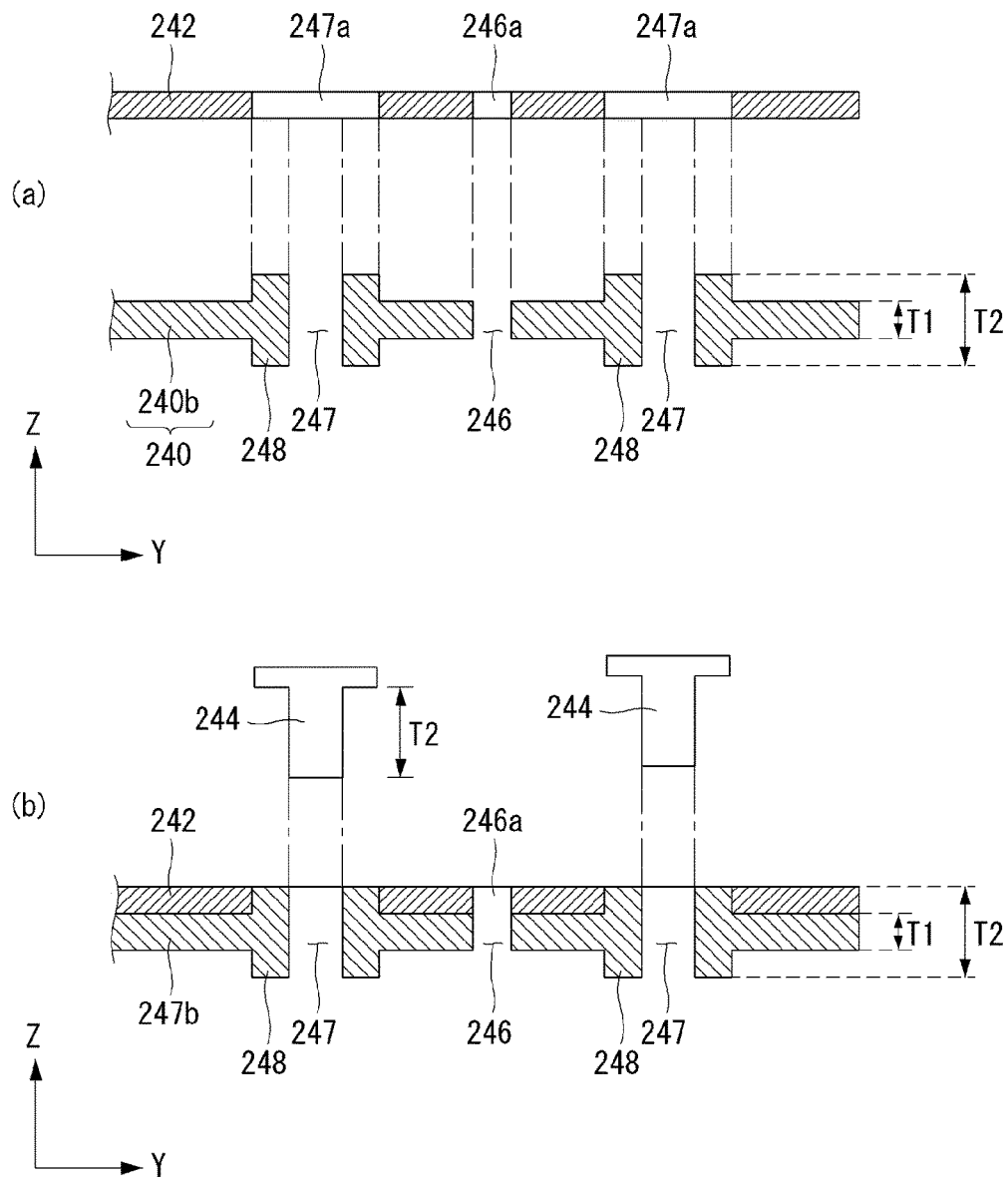

As shown in FIG. 13(*a*), the frame 240 may have first and second coupling holes 247 and 246 and the height of the first coupling hole 247 may be larger than the second coupling hole 246.

The fixer 242 may be provided with first and second through holes 247*a* and 246*a* corresponding to the first and second coupling holes 247 and 246, respectively.

As shown in FIG. 13(*b*), after the fixer 242 is coupled to the frame 240, the screw 244 may be fit into the first coupling hole 247 and the first through hole 247*a*.

The difference T2–T1 in height between the first coupling hole 247 and the second coupling hole 246 or frame 240 may correspond to the thickness of the fixer 242. Accordingly, even after the fixer 242 is coupled, the fixer 242 might not extend beyond the height of the first coupling hole 247. Thus, it may prevent an increase in the overall thickness of the display device 200.

The configuration where the rigid bar(s) 245 are coupled to the module cover 230 described with reference to FIGS. 6 to 9 may also apply to the frame 240 described with reference to FIGS. 10 to 13 such that the rigid bar(s) 245 may be coupled to the frame 240. For example, the rigid bar(s) 245 may be coupled to the module cover 230. As another example, the rigid bar(s) 245 may be coupled to the frame 240. As another example, the rigid bar(s) 245 may be coupled to both the module cover 230 and the frame 240.

Figure 14:
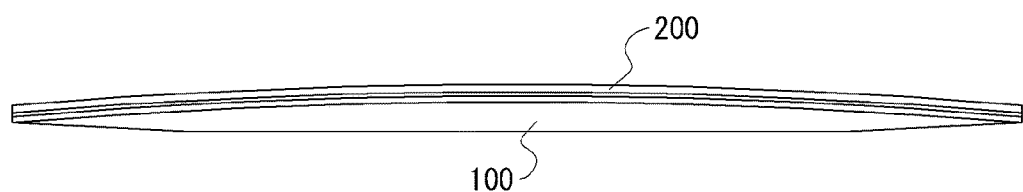
FIG. 14 is a view illustrating an example of an electronic device according to an embodiment of the present invention.

FIG. 14 is a view illustrating an example of an electronic device according to an embodiment of the present invention. FIG. 14 shows a body 100 and a display device 200. Hereinafter, the surface of the body 100 where the body 100 faces the display device 200 is referred to as a front surface of the body 100, and the surface of the display device 200 where the display device 200 faces the body 100 is referred to as a front surface of the display device 200. Further, the surface of the body 100 where the body 100 faces away from the display device 200 is referred to as a rear surface of the body 100, and the surface of the display device 200 where the display device 200 faces outside without facing the body 100 is referred to as a rear surface of the display device 200. Further, when a surface has a predetermined curvature it may be referred to as the surface being curved.

The front surface of the body 100 may be curved. Further, the front surface of the display device 200 may be curved. The rear surface of the body 100 may be curved or flat. The rear surface of the display device 200 may be curved or flat. The front surface of the body 100 may face the front surface of the display device 200. Accordingly, the front surface of the body 100 and the front surface of the display device 200 may be curved in the same manner. When the body 100 and the display device 200 are curved, the rear surface of the body 100 may be configured to be flat so as to increase the structural stability of the display device.

FIGS. 15 to 18 are views illustrating examples of bodies or display devices according to embodiments of the present invention. The surface shown in FIGS. 15 to 18 may be representative of the front surface or rear surface of the body 100 or the display device 200.

The first long side LS1, the second long side LS2, the first short side SS1, and the second short side SS2 may also be defined for description of the body 100 as well as the display device 200.

Figure 20:
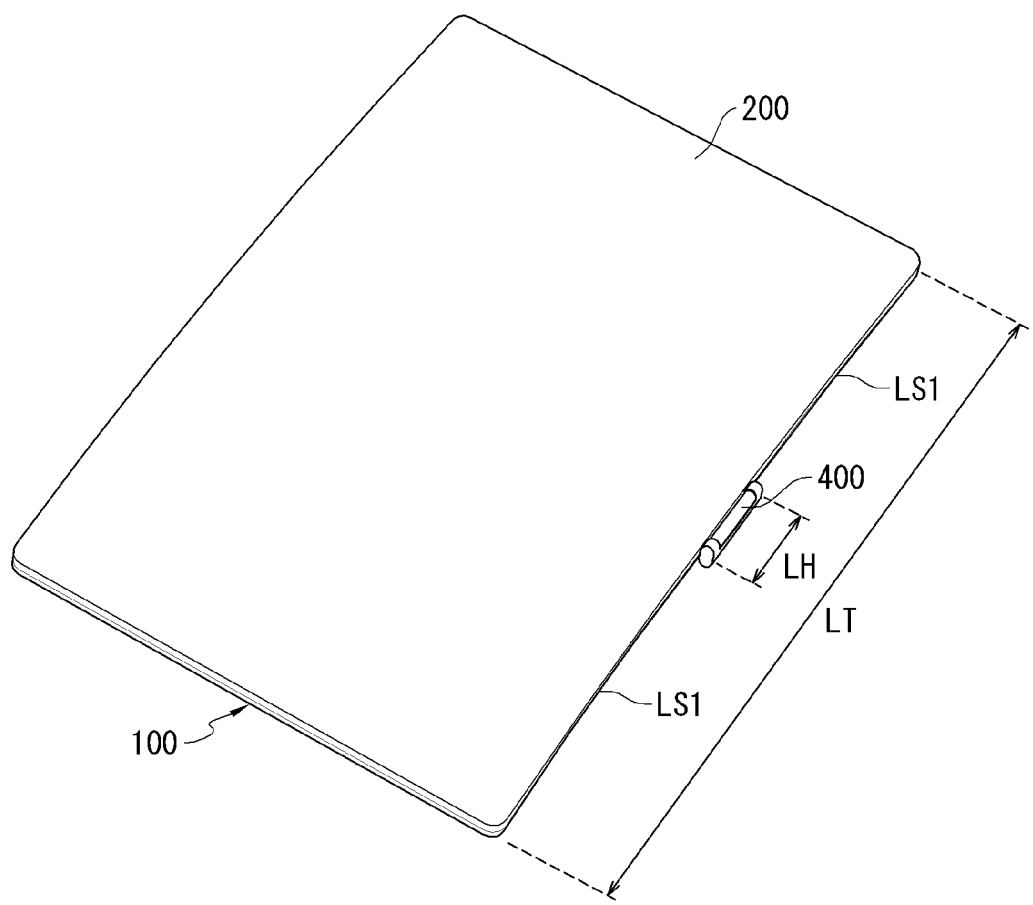
FIGS. 20 and 21 are views illustrating an example of an electronic device according to an embodiment of the present invention.
Figure 21:
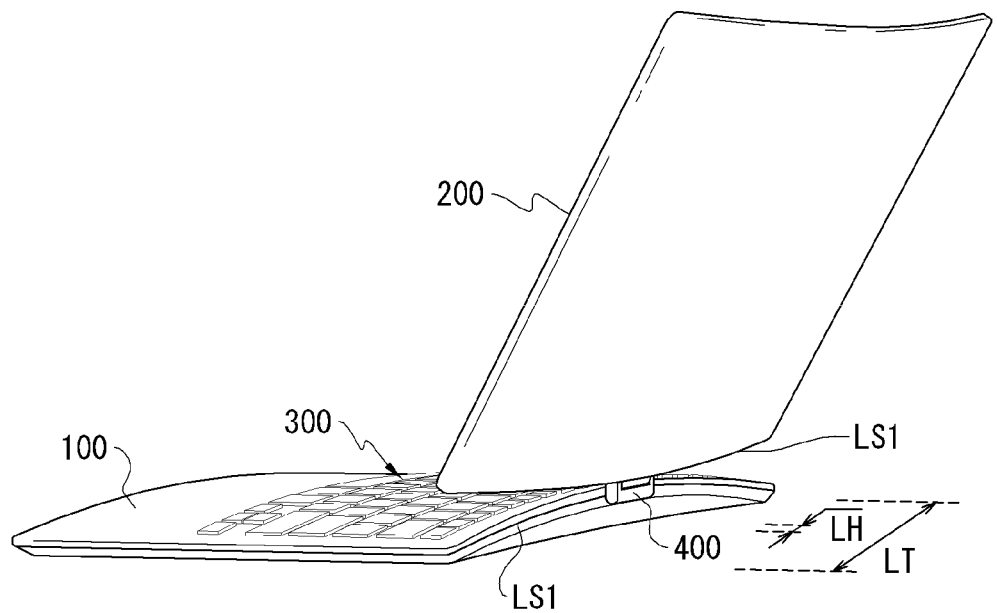

As set forth below, the first long side LS1, the second long side LS2, the first short side SS1, and the second short side SS2 being of straight line, of curve, or being curved may be defined from a point of view of the front surface or rear surface of the body 100 or the display device 200. Here, a point of view of the front surface or rear surface of the body 100 or the display device 200 means being different from a point of view of the side surface of the body 100 or the display device 200. For example, from a point of view of the front surface of the body 100, the first long side LS1 of the body 100 may be a straight line, while from a point of view of the side surface of the body 100, the first long side LS1 of the body 100 may be curved. More specifically, referring to FIGS. 20 and 21, for example, FIG. 20 may be of the point of view of the front surface of the body 100, and FIG. 21 may be of the point of view of the side surface of the body 100. In this case, the first long side LS1 may appear as a straight line as shown in FIG. 20 or as a curve as shown in FIG. 21.

Meanwhile, the point of view of the front surface or rear surface of the body 100 or the display device 200 may be defined as a horizontal direction. Further, the point of view of the side surface of the body 100 or the display device 200 may be defined as a vertical direction.

Meanwhile, the direction orienting from the first long side LS1 to the second long side LS2 or from the second long side LS2 to the first long side LS1 may be defined as an upper or lower direction. Further, the direction oriented from the first short side SS1 to the second short side SS2 or from the second short side SS2 to the first short side SS1 may be defined as a left or right direction.

Figure 15:
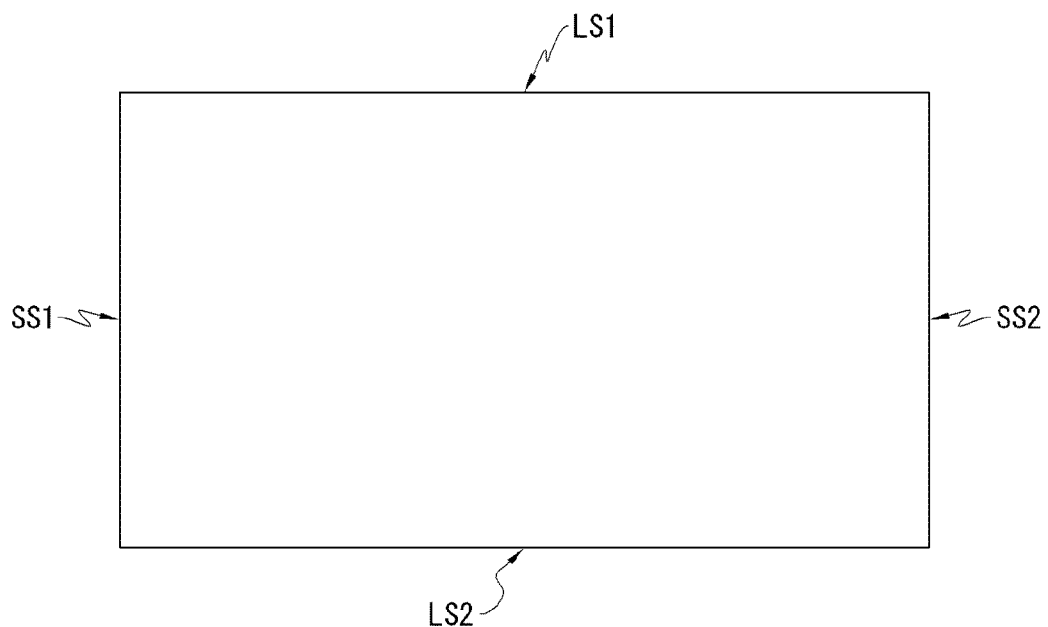
FIGS. 15 to 18 are views illustrating examples of bodies or display devices according to embodiments of the present invention.

Referring to FIG. 15, the first long side LS1, the second long side LS2, the first short side SS1, and the second short side SS2 may be straight lines. For example, that means that the front surface or rear surface of the body 100 or the display device 200 may be rectangular.

Figure 16:
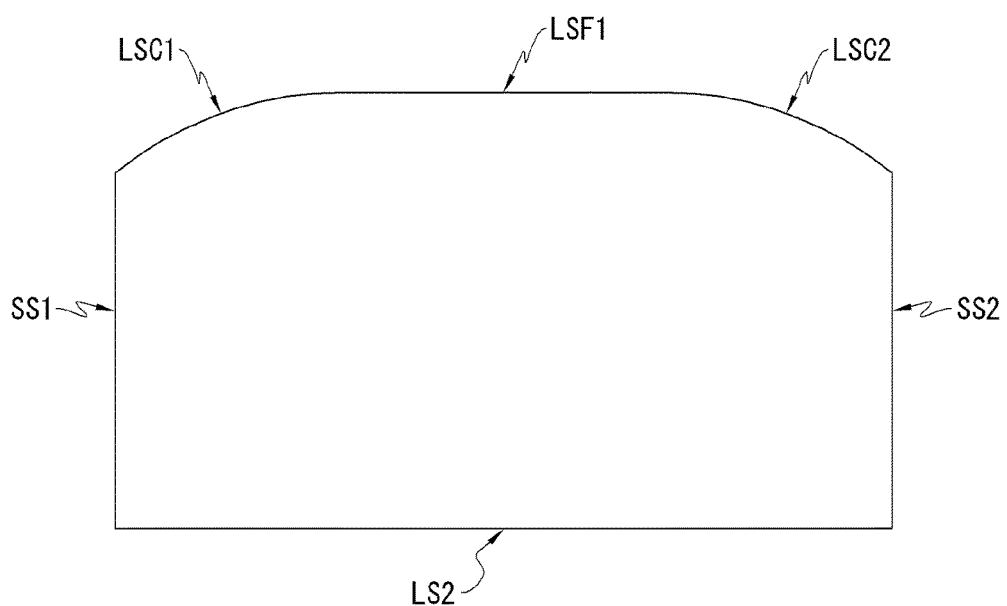

Referring to FIG. 16, the first long side LS1 may include a curved part LSC1 a straight part LSF1 and a curved part LSC2. That is, the curved part LSC1 joins the first short side SS1 to the straight part LSF1 and the curved part LSC2 joins the straight part LSF1 to the short side SS2. The ratio in length of the straight part LSF1 to the curved parts LSC1 may be about 1:1. That is, the length of the straight part LSF1 may be about ⅓ of the overall length of the first long side LS1.

Figure 17:
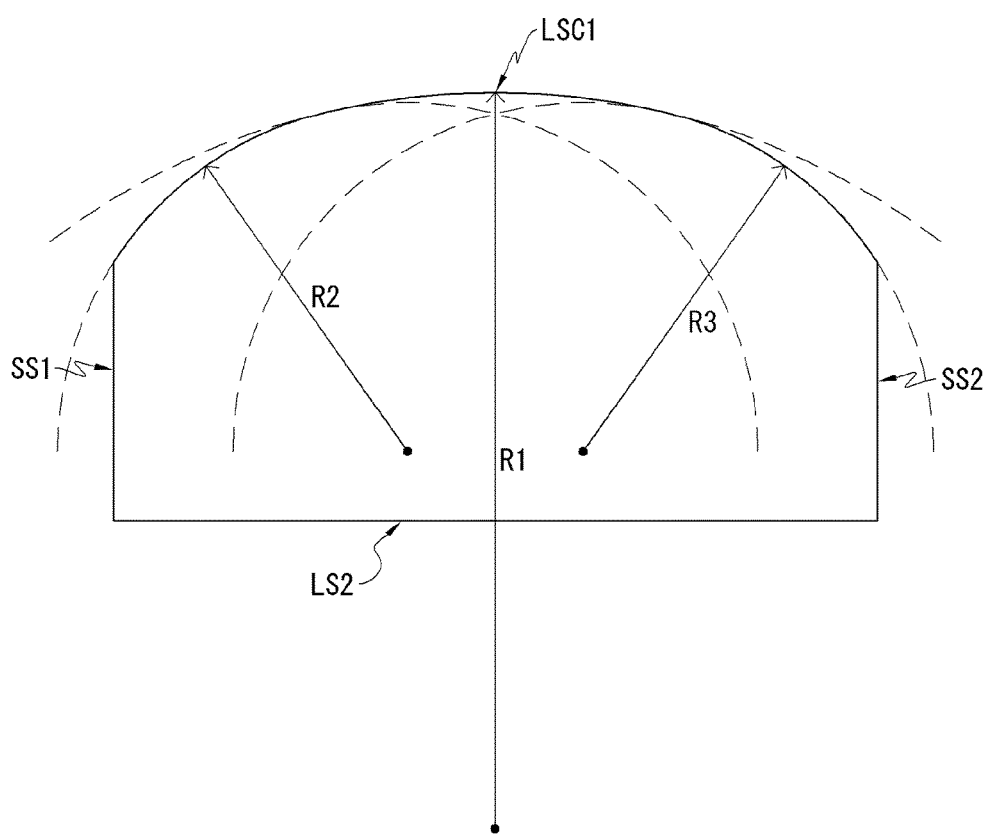

Referring to FIG. 17, the first long side LS1 may be curved. That is, the first long side LS1 may be the curved part LSC1 that joins the first short side SS1 to the second short side SS2. In this case, the curved part LSC1 may be formed to have various curvatures at different locations along its length. For example, radius R1 may differ from radius R2, and radius R1 may differ from radius R3. In contrast, radius R1 may be the same as radius R2, and radius R1 may be the same as radius R3.

Figure 18:
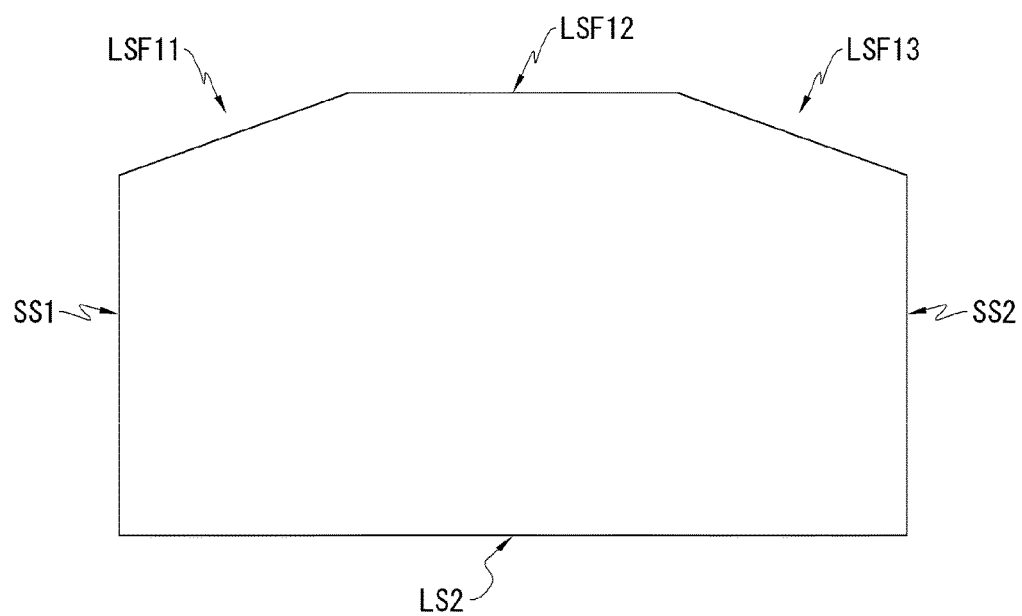

Referring to FIG. 18, the overall first long side LS1 may provide a generally curved shaped in the form of straight parts LSF11, LSF12 and LSF13 connected to each other. The first straight part LSF11 is formed where the first long side LS1 meets the first short side SS1 and may be inclined with respect to the second long side LS2; the third straight part LSF13 is formed where the first long side LS1 meets the second short side SS2 and may be inclined with respect to the second long side LS2; and the second straight part LSF12 may connect the first straight part LSF11 with the third straight part LSF13. In this case, the second straight part LSF12 may be formed to be parallel with the second long side LS2.

Figure 19:
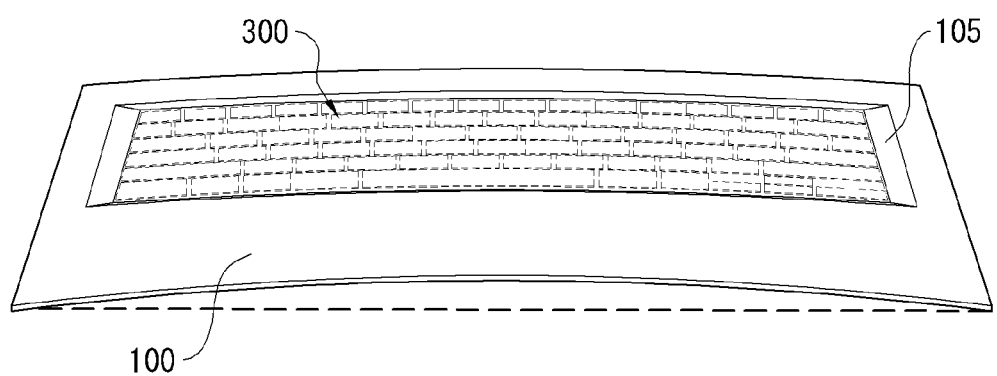
FIG. 19 is a view illustrating an example of a body according to an embodiment of the present invention.

FIG. 19 is a view illustrating an example of a body according to an embodiment of the present invention. FIG. 19 shows a body 100 and an input device 300. The front surface of the body 100 may be curved. The rear surface of the body 100 may be curved or flat. The input device 300 may be provided in the front surface of the body 100. The input device 300 may have various configurations. For example, the input device 300 may include a capacitive keyboard, a resistive keyboard, a mechanical keyboard, a mechanical-electrical keyboard, or a touchpad. The input device 300 may be configured to be overall curved. Meanwhile, the input device 300 may have a curvature corresponding to the curvature of the curved display panel 210 as described above. For example, the input device 300 may face the display panel 210 when the front surface of the display unit 200 faces the front surface of the body 100. As the input device 300 is curved to have an ergonomic shape, enhanced user convenience may be expected.

A portion of the front surface of the body 100 where the input device 300 is positioned may be depressed or recessed. That is, the body 100 may have a depression or recess 105 in its front surface, and the input device 300 may be positioned at the depression 105. The depression 105 may be provided to prevent the input device 300 from externally projecting beyond the front surface of the body 100. Accordingly, when the front surface of the body 100 where the input device 300 is provided faces the front surface of the display device 200, the depression 105 may prevent the input device 300 from damaging the front surface of the display device 200. Further, the input device 300 may have a curvature corresponding to the curvature of the body 100. Accordingly, as the input device 300 is seated in the depression 105, when the front surface of the body 100 where the input device 105 is provided faces the front surface of the display device 200, the depression 300 may prevent the input device 300 from damaging the front surface of the display device 200.

FIGS. 20 and 21 are views illustrating an example of an electronic device according to an embodiment of the present invention. FIGS. 20 and 21 show a body 100, a display device 200, and a hinge 400.

The display device 200 may be curved. The front surface of the display device 200 may be concave, and the rear surface of the display device 200 may be convex. The front surface of the body 100 may overall correspond to the front surface of the display device 200 to face the front surface of the display device 200. That is, the front surface of the body 100 may be curved to correspond to the front surface of the display device 200. The first long side LS1 of the display device 200 may be a straight line. The first long side LS1 of the body 100 may be a straight line. Here, "the first long side LS1 may be a straight line" may mean those described above in connection with FIG. 15.

The length LH of the hinge 400 may be about ⅓ of the overall length LT of the body 100. This may be done for the display device 200 to turn around the hinge 400 from the body 100 when the body 100 and the display device 200 are coupled to the hinge 400.

Figure 22:
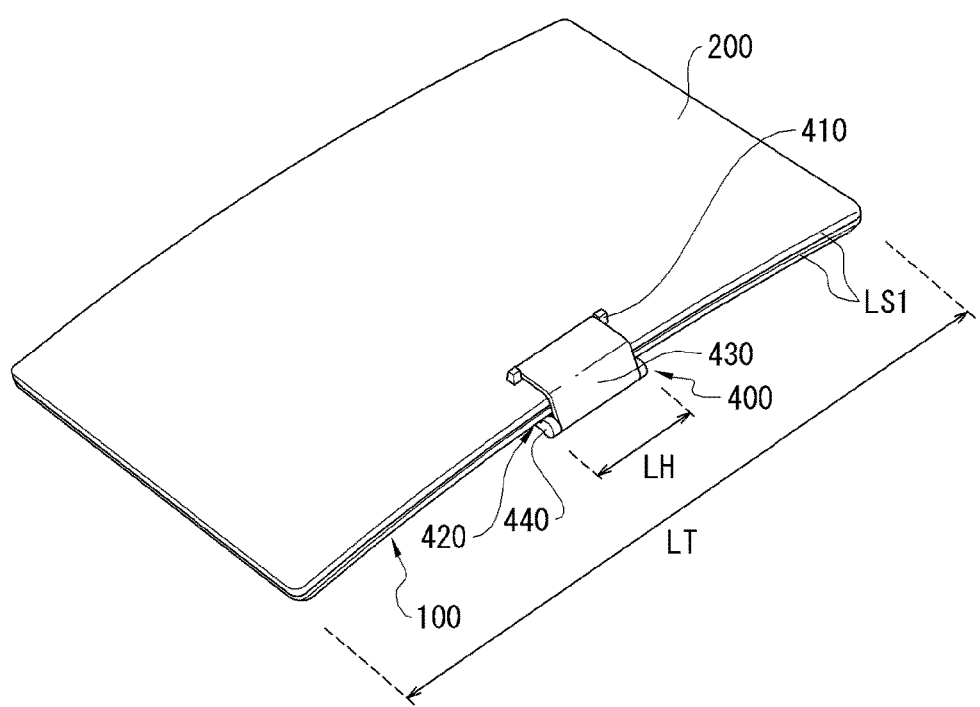
FIGS. 22 and 23 are views illustrating another example of an electronic device according to an embodiment of the present invention.
Figure 23:
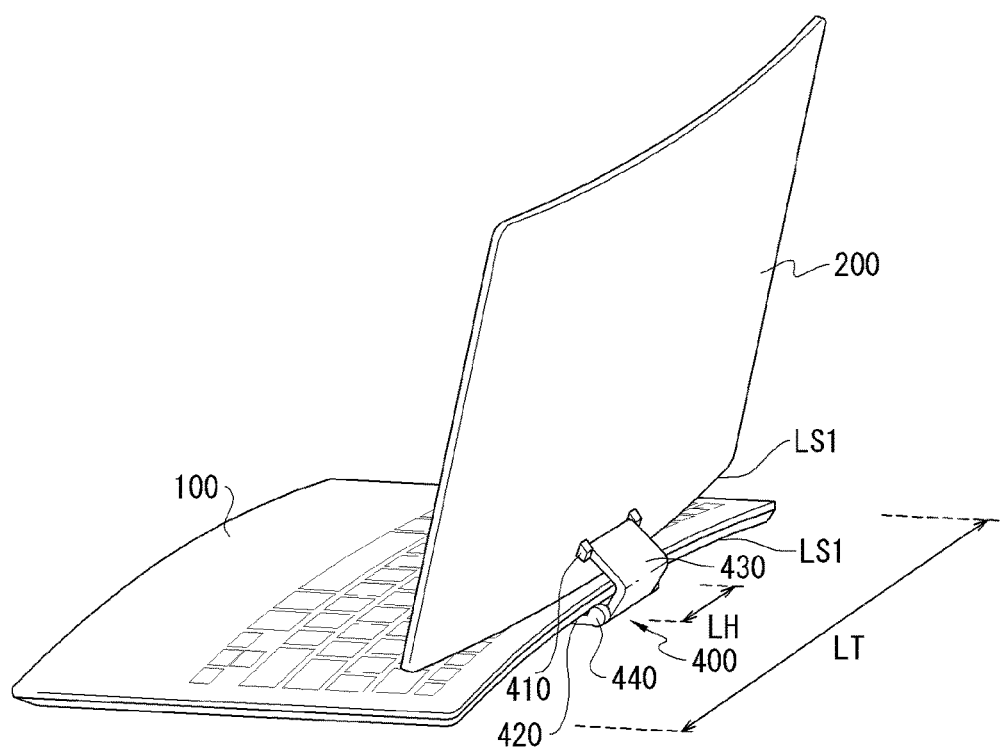

FIGS. 22 and 23 are views illustrating another example of an electronic device according to an embodiment of the present invention. FIGS. 22 and 23 show a body 100, a display device 200, and a hinge 400.

The display device 200 may be curved. The front surface of the display device 200 may be concave, and the rear surface of the display device 200 may be convex. The front surface of the body 100 may overall correspond to the front surface of the display device 200 to face the front surface of the display device 200. That is, the front surface of the body 100 may be curved to correspond to the front surface of the display device 200. The first long side LS1 of the display device 200 may be a straight line. The first long side LS1 of the body 100 may be a straight line. Here, "the first long side LS1 may be a straight line" may mean those described above in connection with FIG. 15.

The hinge 400 may include a first fixing part 410, a second fixing part 420, a rotating part 440, and an extension part 430. The first fixing part 410 may be fastened to a side of the display device 200. The second fixing part 420 may be fastened to a side of the body 100. Specifically, the first fixing part 410 may be fastened to a side of the rear surface of the display device 200, adjacent to the first long side LS1. The second fixing part 420 may be fastened to a side of the rear surface of the body 100, adjacent to the first long side LS1. The rotating part 440 may be fastened to the second fixing part 420. The extension part 430 may connect the first fixing part 410 with the second fixing part 420. Specifically, the extension part 430 may have a side rotatably fixed to the rotating part 440 and another side connected to the first fixing part 410. The extension part 430 may be provided to space the first long side LS1 of the display device 200 apart from the first long side LS1 of the body 100 when the display device 200 rotates from the body 100. That is, it may prevent the first long side LS1 of the display device 200 from being struck by the first long side LS1 of the body 100 when the display device 200 rotates from the body 100, which may otherwise occur because the display device 200 or the body 100 is formed to be curved. To that end, the extension part 430 may be shaped as an "L" or overturned "L".

Figure 24:
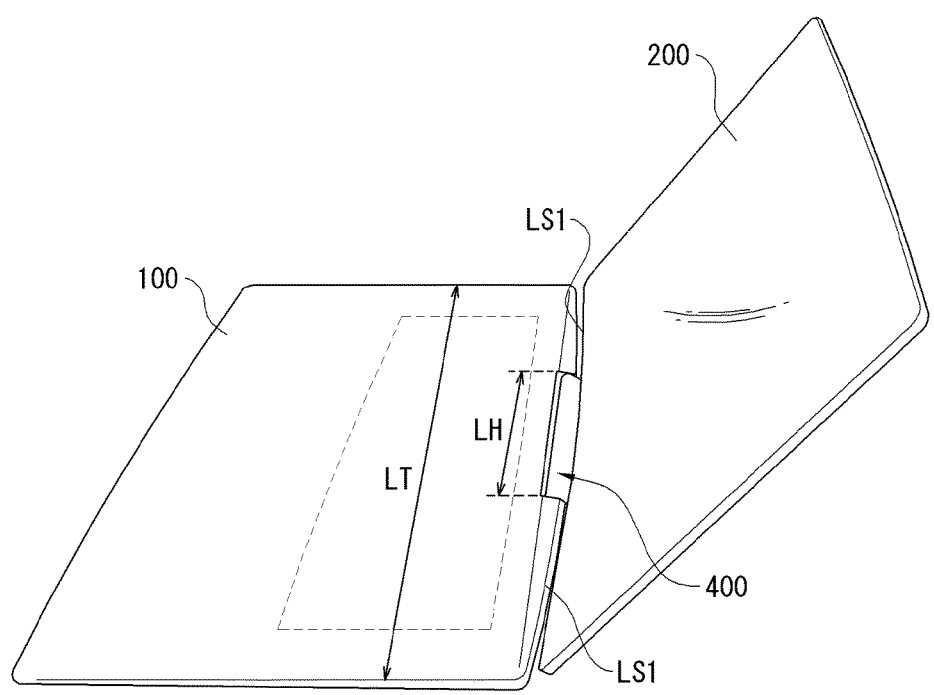
FIG. 24 is a view illustrating another example of an electronic device according to an embodiment of the present invention.

FIG. 24 is a view illustrating another example of an electronic device according to an embodiment of the present invention. FIG. 24 shows a body 100, a display device 200, and a hinge 400.

The display device 200 may be curved. The front surface of the display device 200 may be concave, and the rear surface of the display device 200 may be convex. The front surface of the body 100 may overall correspond to the front surface of the display device 200 to face the front surface of the display device 200. That is, the front surface of the body 100 may be curved to correspond to the front surface of the display device 200. In this case, the first long side LS1 of the body 100 may also be curved. Here, "the first long side LS1 of the body 100 may be curved" may mean those described above in connection with FIGS. 16 to 18. This may be done for the display device 200 to turn around the hinge 400 from the body 100 when the body 100 and the display device 200 are coupled to the hinge 400. The length LH of the hinge 400 may be not more than ⅓ of the overall length LT of the body 100.

In this case, the first long side LS1 of the display device 200 may also be curved. Here, "the first long side LS1 of the display device 200 may be curved" may mean those described above in connection with FIGS. 16 to 18. This may be done for the display device 200 to turn around the hinge 400 from the body 100 when the body 100 and the display device 200 are coupled to the hinge 400.

Figure 25:
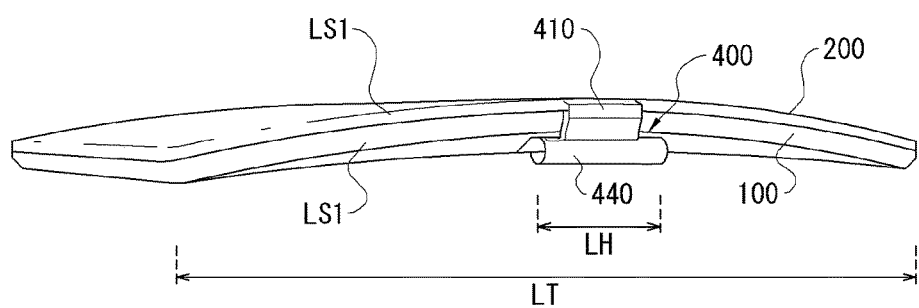
FIG. 25 is a view illustrating another example of an electronic device according to an embodiment of the present invention.

FIG. 25 is a view illustrating another example of an electronic device according to an embodiment of the present invention. FIG. 25 shows a body 100, a display device 200, and a hinge 400.

The display device 200 may be curved. The front surface of the display device 200 may be concave, and the rear surface of the display device 200 may be convex. The front surface of the body 100 may overall correspond to the front surface of the display device 200 to face the front surface of the display device 200. That is, the front surface of the body 100 may be curved to correspond to the front surface of the display device 200. The first long side LS1 of the display device 200 may be a straight line. The first long side LS1 of the body 100 may be a straight line. Here, "the first long side LS1 may be a straight line" may mean those described above in connection with FIG. 15.

Meanwhile, the rear surface of the body 100 may be curved. The hinge 400 may be provided in the curved rear surface of the body 100. Specifically, the rotating part 440 of the hinge 400 may be installed in the rear surface of the curved body 100, and the first fixing part 410 connected to the rotating part 440 and extending may be fastened to a side of the display device 200. For example, the rotating part 440 may be fastened to be positioned between the rear surface of the body 100 and the first long side LS1, and the first fixing part 410 may be fastened to a side surface of the first long side LS1 of the display device 200. The length LH of the hinge 400 may be about ⅓ of the overall length LT of the body 100. This may be done for the display device 200 to turn around the hinge 400 from the body 100 when the body 100 and the display device 200 are coupled to the hinge 400.

Figure 26:
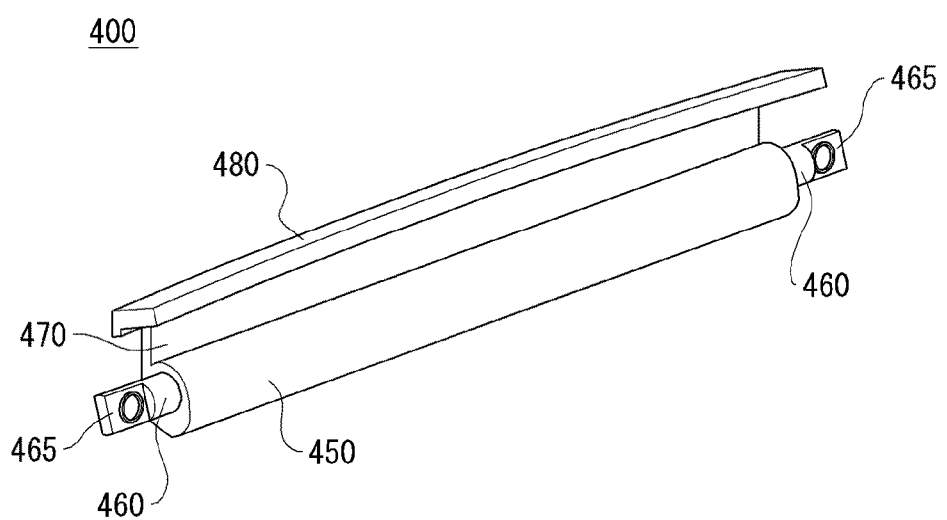
FIGS. 26 and 27 are views illustrating examples of hinges according to embodiments of the present invention.
Figure 27:
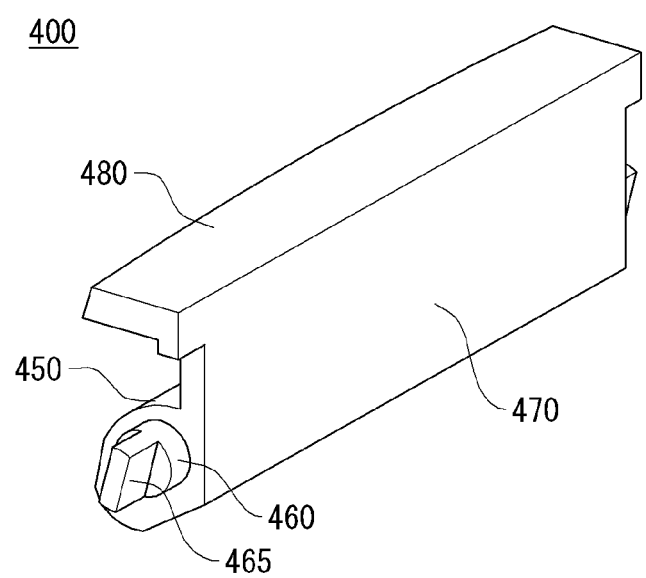

FIGS. 26 and 27 are views illustrating examples of hinges according to embodiments of the present invention. FIGS. 26 and 27 show a rotating part 450, a hinge shaft 460, an extension part 470, a first fixing part 480, and a second fixing part 465.

The rotating part 450 may be shaped as a cylinder extending along a rotational axis. The hinge shaft 460 may be provided inside the rotating part 450. The hinge shaft 460 may project to the outside of left and right side surfaces of the rotating part 450. The second fixing part 465 may be formed at an end of the hinge shaft 460. The second fixing part 465 may be tapered. The extension part 470 may be fixed to a side of the rotating part 450. The extension part 470 may extend from the rotating part 450 at a predetermined distance. The first fixing part 480 may extend from an end of the extension part 470. In this case, the first fixing part 480 may extend in a different direction from the direction where the extension part 470 extends from the rotating part 450 such that the extension part 470 and the first fixing part 480 may extend on different planes. For example, the extension part 470 and the first fixing part 480 may be overall shaped as an "L" or overturned "L".

Figure 28:
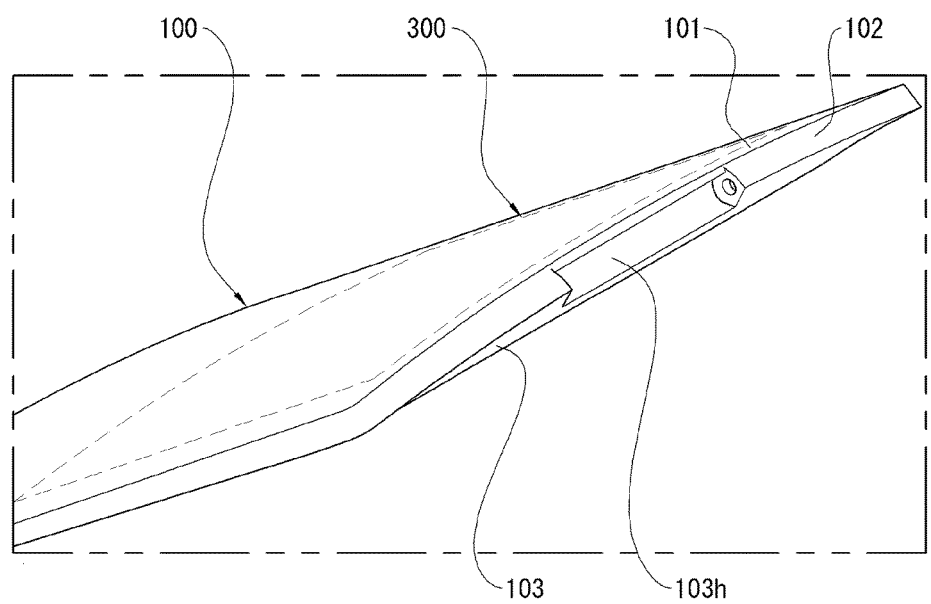
FIGS. 28 to 30 are views illustrating other examples of bodies according to embodiments of the present invention.
Figure 29:
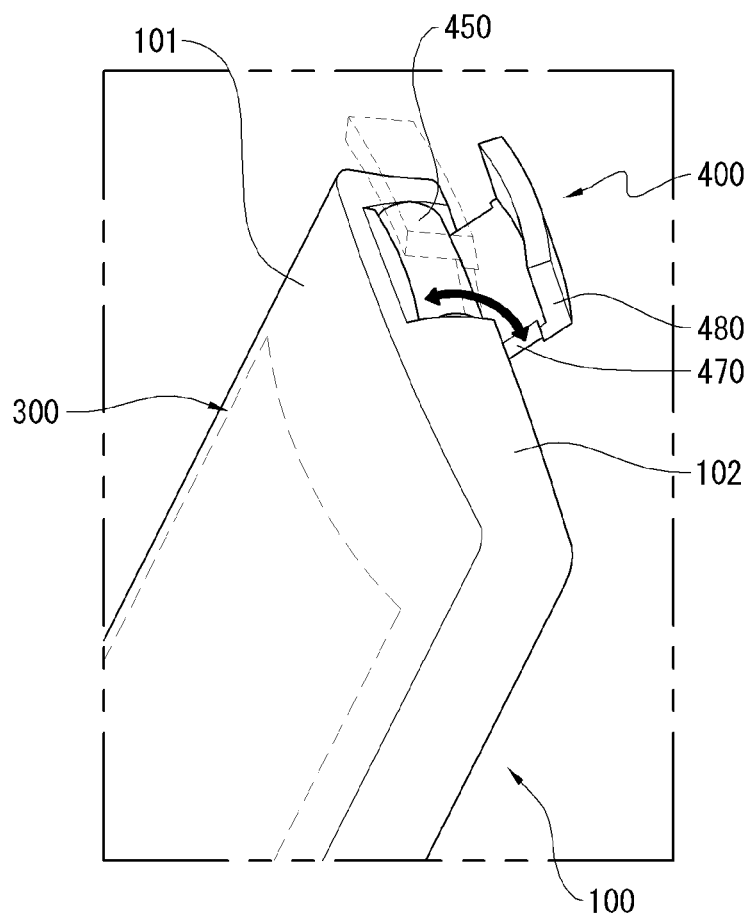
Figure 30:
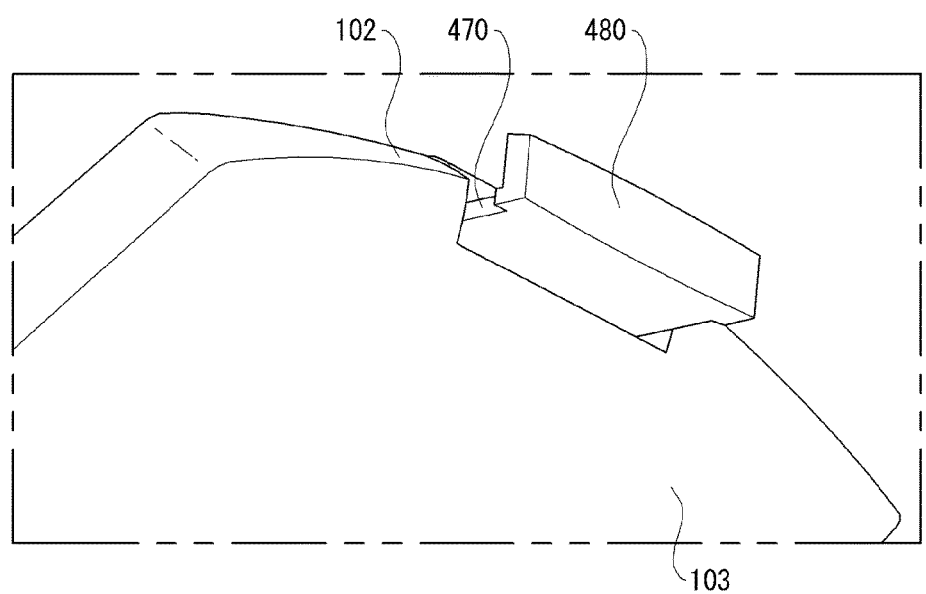

FIGS. 28 to 30 are views illustrating other examples of bodies according to embodiments of the present invention. FIGS. 28 to 30 show a body 100, a front surface 101 of the body, a rear surface 103 of the body, a side surface 102 of the body, and a hinge 400.

Referring to FIG. 28, the front surface 101 of the body 100 may be curved. An input device 300 may be provided in the front surface 101 of the body 100. The rear surface 103 of the body 100 may be flat. The area where the front surface 101 of the body 100 meets the side surface 102 or the area where the side surface 102 of the body 100 meets the rear surface 103 of the body 100 may be the first long side LS1. The first long side LS1 may be curved as described with reference to FIGS. 16 to 18. Accordingly, when rotating about the hinge 400 from the body 100, the display device 200 may be rotated without being struck by the body 100. In other words, the range in which the display device 200 rotates might not be limited by the shape of the body 100 or the display device 200.

The body 100 may have a depression 103h. The depression 103h may be formed at a side of the body 100. The depression 103h may be thin and long. The depression 103h may correspond in shape to the outer surface of the rotating part 450 of the hinge 400. The depression 103h may be formed as the side surface 102 of the body 100 and the rear surface 103 of the body 100 are depressed to the inside of the body 100. As a result, the front surface 101 of the body 100 may have no area that is recessed to form the depression 103h. The length LH of the depression 103h may be about ⅓ of the overall length LT of the body 100.

Referring to FIGS. 29 and 30, the extension part 470 may shift onto the rear surface 103 of the body 100 from the side surface 102 of the body 100 with respect to the center of the rotating part 450. Further, as the extension part 470 shifts onto the rear surface 103 of the body 100 from the side surface of the body 100 with respect to the center of the rotating part 450, the first fixing part 480 may shift from the front surface 101 of the body 100 to the side surface 102 of the body 100. That is, the extension part 470 may differ in range of shift from the first fixing part 480. The range of shift of the extension part 470 may be rendered to differ from the range of shift of the first fixing part 480. Accordingly, the display device 200 may rotate from the body 100, spaced apart from the body 100 at a predetermined distance.

Figure 31:
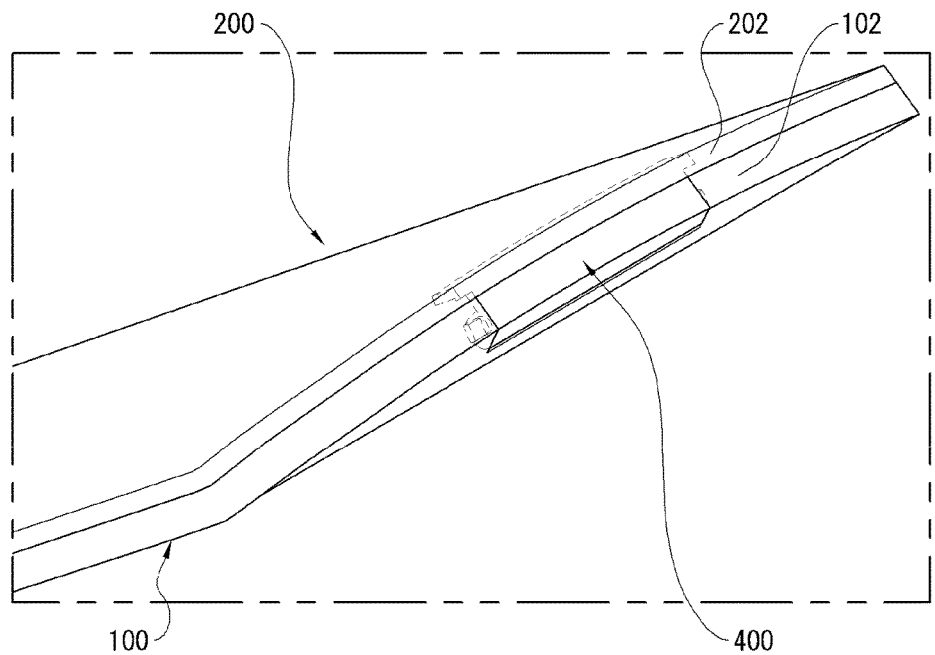
FIGS. 31 and 32 are views illustrating other examples of an electronic device according to an embodiment of the present invention.
Figure 32:
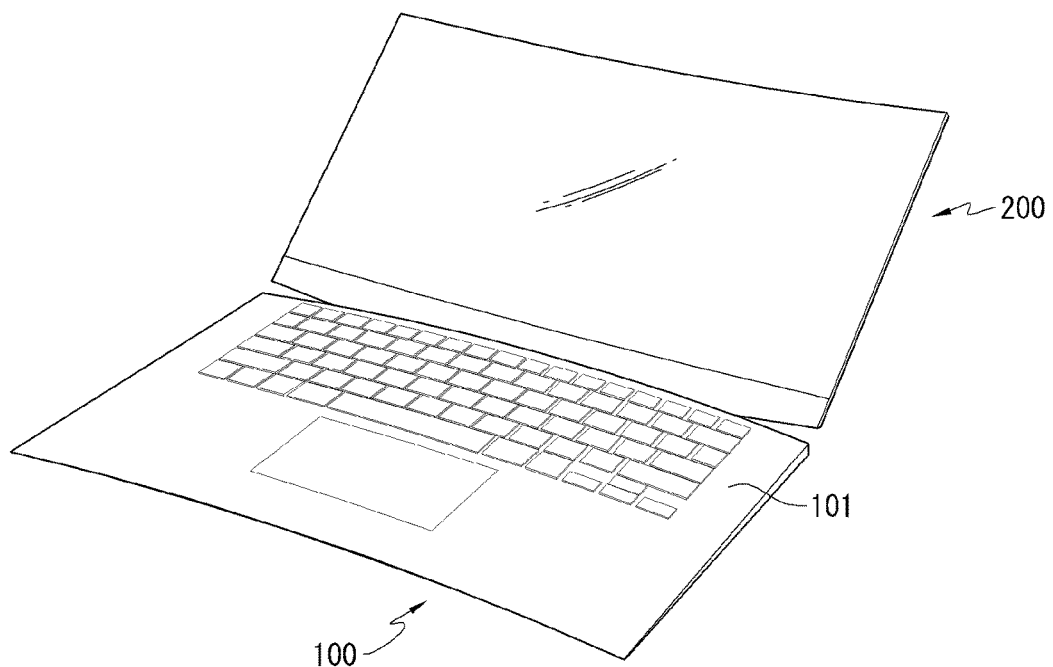

FIGS. 31 and 32 are views illustrating other examples of an electronic device according to an embodiment of the present invention. FIGS. 31 and 32 show a body 100, a display device 200, and a hinge 400.

Referring to FIG. 31, the hinge 400 inserted into the depression 103h of the body 100 might not externally project with respect to the outer surface of the body 100.

Further, the extension part 470 might not project to the outside of the side surface 202 of the display device 200 and the side surface 102 of the body 100 constituting the first long side LS1, with the front surface of the display device 200 facing the front surface of the body 100. The first fixing part 480 may be integrally formed with the display device 200. Further, the extension part 470 connecting to the first fixing part 480 may also be integrally formed from the first fixing part 480.

Referring to FIG. 32, the display device 200 has been rotated from the body 100. As the first long side LS1 of the body 100 and/or the first long side LS1 of the display device 200 is curved, and the hinge 400 has the extension part 470, the display device 200 may rotate from the body 100. In this case, in the front surface 101 of the body 100, the hinge 400 is not externally exposed, allowing an aesthetic look. Such a case may occur where the outside of the hinge 400 is exposed to the outside as the display device 200 rotates from the body 100. That means that, in such case, the extension part 470 covers the outside of the hinge 400 not externally exposed when the front surface of the display unit 200 faces the front surface of the body 100, providing an aesthetic look. This may best be seen in FIG. 31.

Figure 33:
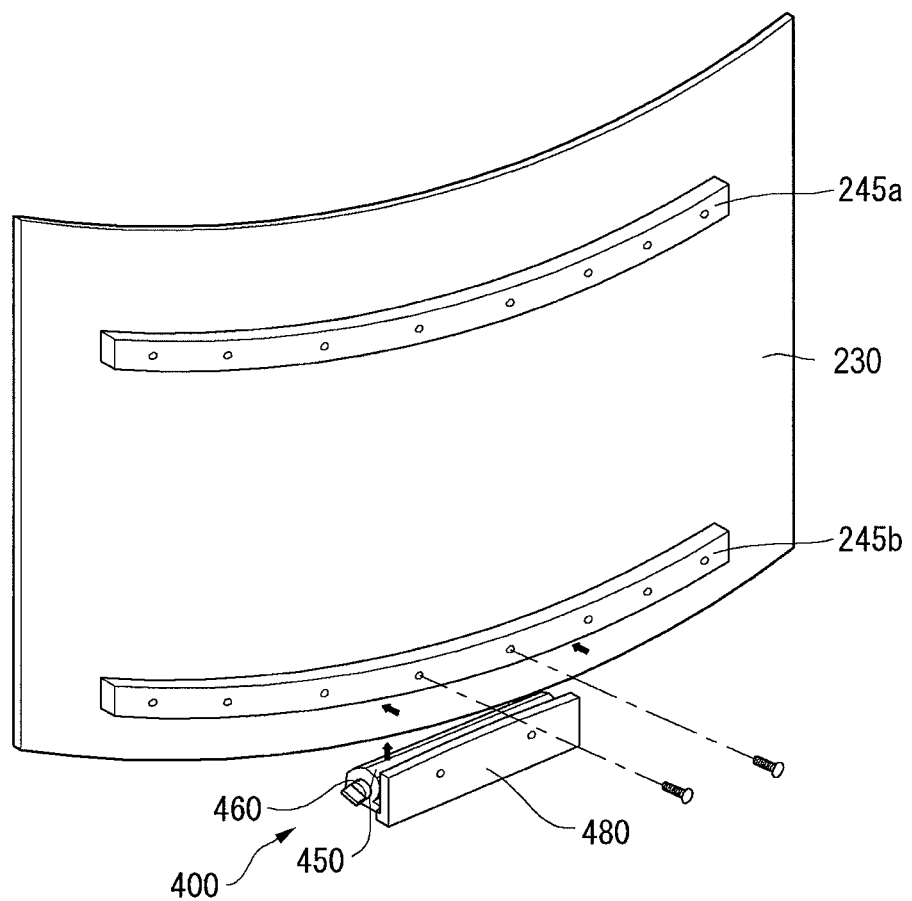
FIGS. 33 to 36 are views illustrating examples of combining structures of hinges according to embodiments of the present invention.
Figure 34:
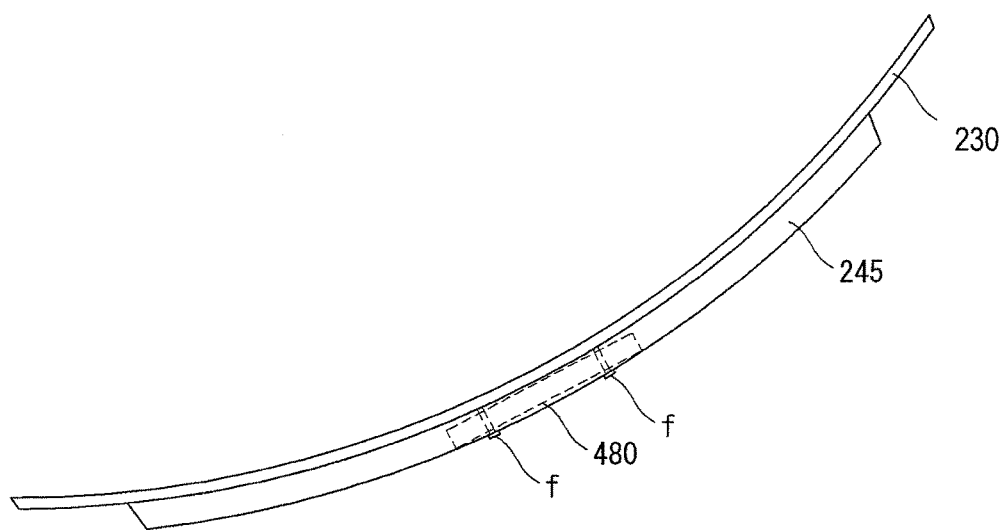
Figure 35:
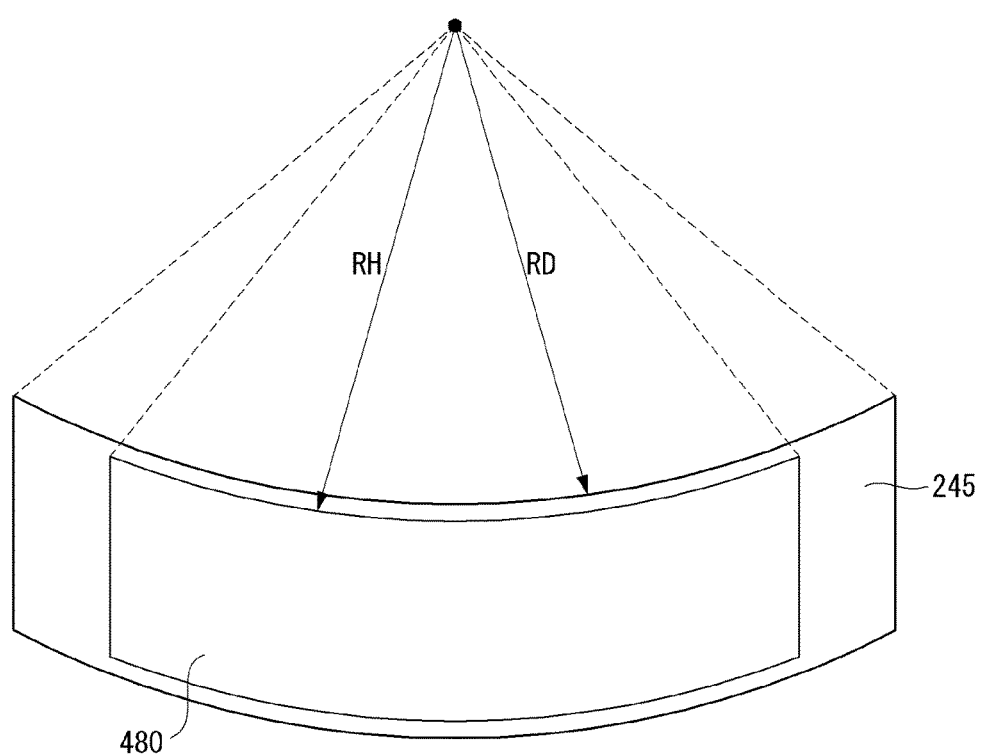
Figure 36:
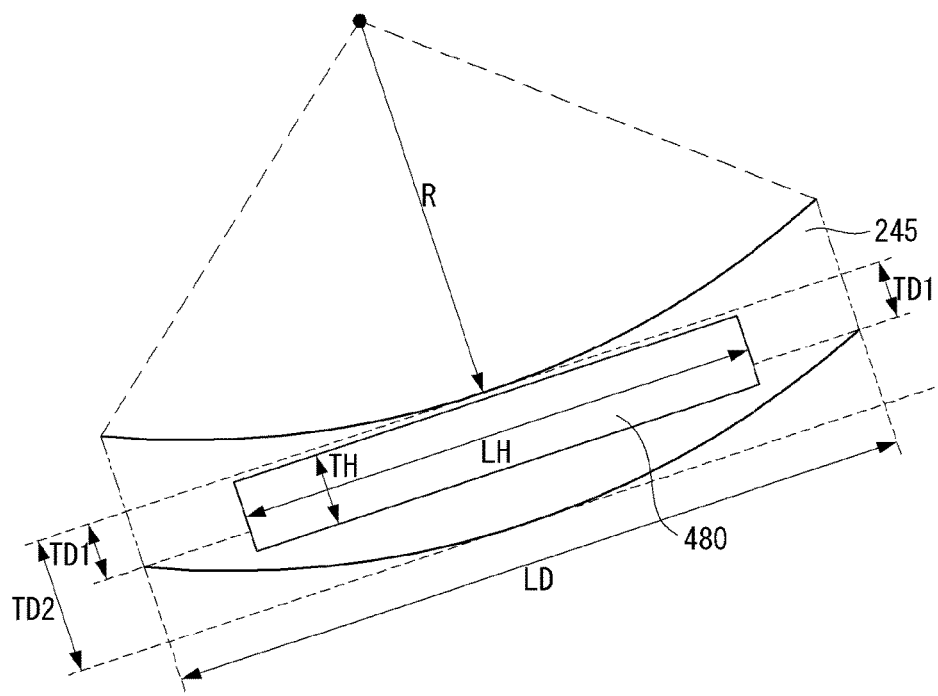

FIGS. 33 to 36 are views illustrating examples of combining structures of hinges according to embodiments of the present invention. FIG. 33 shows an example of a structure where a hinge 400 is coupled to a rigid bar 245, FIG. 34 shows an example of a cross section where a hinge 400 is coupled to a rigid bar 245, and FIGS. 35 and 36 show examples of structure appropriate for a coupling between a rigid bar 245 and a hinge 400.

Referring to FIGS. 33 and 34, the rigid bar 245 may be coupled to a surface of the module cover 230. As described above, a plurality of rigid bars 245 may be coupled to the module cover 230. For example, a first rigid bar 245a may be coupled to an upper side of a surface of the module cover 230, and a second rigid bar 245b may be coupled to a lower side of the surface of the module cover 230. In this case, the first rigid bar 245a may be positioned parallel with the second rigid bar 245b.

The hinge 400 may be coupled to the rigid bar 245. For example, the hinge 400 may be pressed and fitted into the rigid bar 245. As another example, the hinge 400 may be fixed to the rigid bar 245 by a coupling member f. As another example, after pressed and fitted into the rigid bar 245, the hinge 400 may be fixed by the coupling member f. As described above, the first fixing part 480 of the hinge 400 may be fitted or fixed to the rigid bar 245.

Referring to FIG. 35, the rigid bar 245 may have a curvature RD. The first fixing part 480 of the hinge 400 may have a curvature RH. The curvature RD of the rigid bar 245 may equal or differ from the curvature RH of the first fixing part 480. In this case, the size, length, or thickness of the first fixing part 480 may be within a range of size, length, or thickness of the rigid bar 245. In other words, when the curvature RD of the rigid bar 245 is the same as the curvature RH of the first fixing part 480, a standard may be determined by the rigid bar 245 for the first fixing part 480 to couple with the rigid bar 245.

Referring to FIG. 36, the curvature R of the rigid bar 245 may differ from the curvature of the first fixing part 480 of the hinge 400. The curvature R of the rigid bar 245 differing from the curvature of the first fixing part 480 may mean that the first fixing part 480 of the hinge 400 may be curved or straight, whichever is desirable. With reference to FIG. 36, an example in which the first fixing part 480 of the hinge 400 is straight is described.

The rigid bar 245 may have a curvature R. The first fixing part 480 of the hinge 400 may be shaped as a straight line. The rigid bar 245 may have a constant thickness TD2. The first fixing part 480 of the hinge 400 may have a thickness within a range of the thickness TD2 of the rigid bar 245.

The thickness TH of the first fixing part 480 of the hinge 400 may be as long as, e.g., the distance TD2 formed by, a maximum tangent of the rigid bar 245 on an inner curve and a tangent on an outer curve. To that end, the length LH of the first fixing part 480 of the hinge 400 may be significantly shorter as compared with the length LD of the rigid bar 245. For example, the hinge 400 may be formed to have a length described with reference to FIGS. 20 to 23 and 25.

The thickness TH of the first fixing part 480 of the hinge 400, as another example, may be as long as the distance TD1 formed by the minimum tangent of the rigid bar 245 on the inner curve and a line connecting both outer edges of the rigid bar 245. In this case, the length LH of the first fixing part 480 of the hinge 400 may be formed to be substantially longer, while approaching the length LD of the rigid bar 245. For example, the length LH of the first fixing part 480 of the hinge 400 may equal the maximum length LD of the rigid bar 245.

The thickness TH of the first fixing part 480 of the hinge 400, as another example, may be from the distance TD1 between the tangent of the rigid bar 245 on the inner curve and the line connecting both outer edges of the rigid bar 245 to the distance TD2 between the tangent of the rigid bar 245 on the inner curve and the outer curve of the rigid bar 245. In this case, the length LH of the first fixing part 480 of the hinge 400 may be formed to have a length as described with reference to FIGS. 24 and 26 to 31.

FIGS. 37 to 40 are views illustrating examples of hinge combining structures according to embodiments of the present invention.

Figure 37:
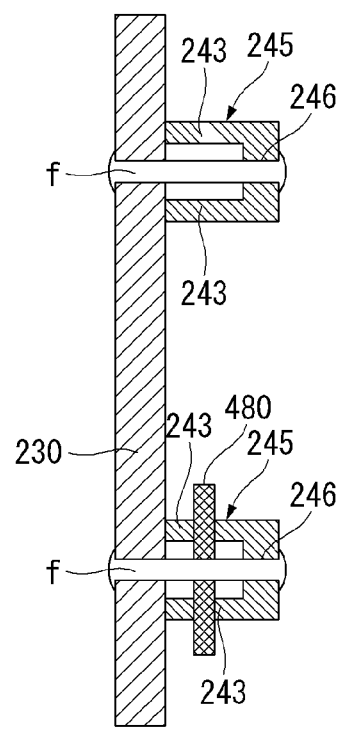
FIGS. 37 to 40 are views illustrating examples of hinge combining structures according to embodiments of the present invention.

Referring to FIG. 37, the rigid bar 245 may be coupled to the module cover 230. In this case, the reinforcing rib 243 may support the rigid bar 245 while contacting a surface of the module cover 230. A plurality of reinforcing ribs 243 may contact a surface of the module cover 230. The coupling hole 246 may be formed in the rigid bar 245 in the area other than the reinforcing rib 243. When a plurality of reinforcing ribs 243 contact a surface of the module cover 230 to support the rigid bar 245, the coupling hole 246 may face a surface of the module cover 230. In this case, a coupling member f may couple the rigid bar 245 with the module cover 230 through the coupling hole 246. Accordingly, the rigid bar 245 may be coupled to the module cover 230 while minimizing the contact between the rigid bar 245 and the module cover 230. In this case, as set forth above in connection with FIGS. 33 to 36, the first fixing part 480 of the hinge 400 may be coupled to the rigid bar 245. The coupling member f may couple the rigid bar 245 and the first fixing part 480 of the hinge 400 to the module cover 230. Thus, a firm coupling may be formed between the hinge 400 and the display unit 200.

Figure 38:
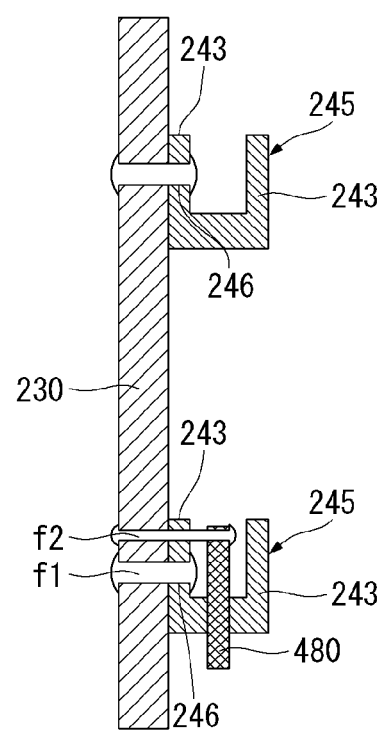
Figure 40:
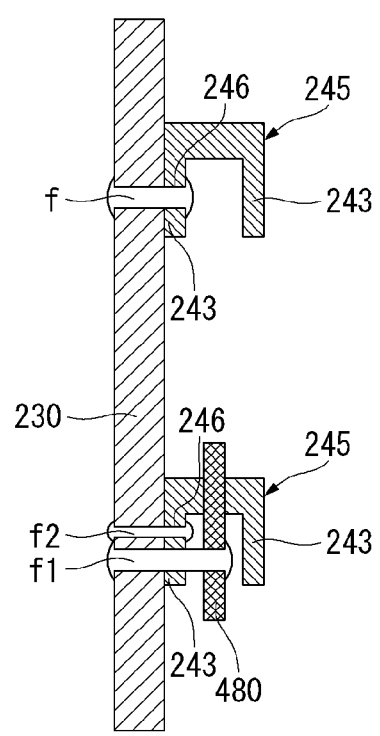

Referring to FIG. 38, the rigid bar 245 may be coupled to the module cover 230. A plurality of reinforcing ribs 243 may be provided in the rigid bar 245. As any one of the plurality of reinforcing ribs 243 contacts a surface of the module cover 230, the rigid bar 245 may be supported. The coupling hole 246 may be formed in the reinforcing rib 243 that contacts a surface of the module cover 230. The direction in which the rigid bar 245 is coupled may be varied as shown in FIG. 40. When any one of the plurality of reinforcing ribs 243 contacts the module cover 230, the coupling hole 246 formed therein may be positioned opposite the module cover 230. The coupling member f may couple the rigid bar 245 to the module cover 230 through the coupling hole 246. In this case, as set forth above in connection with FIGS. 33 to 36, the first fixing part 480 of the hinge 400 may be coupled to the rigid bar 245. The coupling member f may couple the rigid bar 245 and the first fixing part 480 of the hinge 400 to the module cover 230. Thus, a firm coupling may be formed between the hinge 400 and the display unit 200.

As another example, a plurality of coupling members f may be used. A first coupling member f1 may couple the rigid bar 245 to the module cover 230. The second coupling member f2 may couple the first fixing part 480 of the hinge 400 to the module cover 230. Further, the second coupling member f2 may couple the first fixing part 480 of the hinge 400 and the rigid bar 245 to the module cover 230. Thus, a reinforced coupling may be formed between the hinge 400 and the display unit 200.

Figure 39:
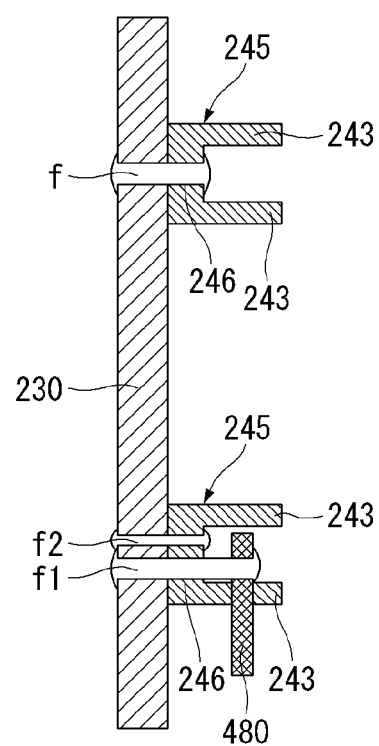

Referring to FIG. 39, the rigid bar 245 may be coupled to the module cover 230. In this case, the reinforcing rib 243 might not contact a surface of the module cover 230. The coupling hole 246 may be formed in the rigid bar 245 in an area other than the reinforcing rib 243, such as a base of the rigid bar 245. The coupling hole 246 may be positioned opposite a surface of the module cover 230. In this case, a coupling member f may couple the rigid bar 245 with the module cover 230 through the coupling hole 246. In this case, as set forth above in connection with FIGS. 33 to 36, the first fixing part 480 of the hinge 400 may be coupled to the rigid bar 245. The coupling member f may couple the rigid bar 245 and the first fixing part 480 of the hinge 400 to the module cover 230.

As another example, a plurality of coupling members f may be used. The second coupling member f2 may couple the rigid bar 245 to the module cover 230. The first coupling member f1 may couple the first fixing part 480 of the hinge 400 to the module cover 230. Further, the first coupling member f1 may couple the first fixing part 480 of the hinge 400 and the rigid bar 245 to the module cover 230. Thus, a reinforced coupling may be formed between the hinge 400 and the display unit 200.

In the above-described embodiments, the length LH of the hinge 400 may be limited to be within a predetermined range by the shape of the display unit 200 including the curved display panel 210 or its corresponding curved body 100. This may be why the display unit 200 including the curved display panel 210 or its corresponding curved body 100 might not be coupled via a plurality of hinges. In other words, that means that the length LH of the hinge 400 may be limited for a proper coupling for the curved structure when coupling the display unit 200 with the body 100 by way of one hinge 400.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic device comprising:
   a display including a curved display panel;
   a curved body, the curved body having an input unit at a curved surface of the curved body, the curved surface of the curved body corresponding to a curvature of the curved display panel; and
   a hinge connecting the display to the curved body, the hinge including:
      a hinge shaft connected to the curved body; and
      a fixing part rotating around the hinge shaft, the fixing part connected to the display, the fixing part having a curved shape, the curved shape corresponding to the curvature of the curved display panel.

2. The electronic device of claim 1, wherein the input unit is a curved keypad having a curvature corresponding to the curvature of the curved display panel.

3. The electronic device of claim 1, wherein the curved body has a flat surface opposite the curved surface of the curved body.

4. The electronic device of claim 1, wherein the curved display panel has a concave front surface, and
   wherein the curved body has a convex front surface.

5. The electronic device of claim 1, wherein the curved display panel is concave in a left or right direction, and
   wherein the curved body is convex in said left or right direction.

6. The electronic device of claim 1, wherein the curved body has a convex front surface, and
   wherein the input unit is positioned in the convex front surface of the curved body.

7. The electronic device of claim 1, wherein the curved body has a convex front surface, the convex front surface of the curved body having a recess, and
   wherein the input unit is positioned in the recess.

8. The electronic device of claim 1, wherein an edge of the curved body or the display connected to the hinge has a convex part to receive a portion of the hinge.

9. The electronic device of claim 1, wherein an edge of the curved body or the display connected to the hinge includes a plurality of straight parts to define a generally convex shape.

10. The electronic device of claim 1, wherein the display includes a first long side, a second long side positioned parallel with and opposite the first long side, a first short side positioned at an end of the first long side and an end of the second long side, and a second short side positioned parallel with and opposite the first short side at another end of the first long side and another end of the second long side,
   wherein the curved body includes a first long side, a second long side positioned parallel with and opposite the first long side, a first short side positioned at an end of the first long side and an end of the second long side, and a second short side positioned parallel with and opposite the first short side at another end of the first long side and another end of the second long side,
   wherein a front surface of the curved display panel is concave along a direction from the first short side to the second short side, and
   wherein a front surface of the curved body is convex along a direction from the first short side to the second short side.

11. The electronic device of claim 10, wherein the hinge is positioned adjacent to the first long side of the curved body and the first long side of the display to connect the curved body to the display.

12. The electronic device of claim 1, wherein the display further includes:
   a curved plate, the curved display panel positioned in front of a concave surface of the curved plate;
   a curved module cover positioned behind a convex surface of the curved plate, and
   a rigid bar coupled to the curved module cover.

13. The electronic device of claim 12, wherein a side of the hinge is coupled to the rigid bar.

14. The electronic device of claim 13, wherein the hinge further includes:
   a rotating part rotating around the hinge shaft; and
   an extension part extending from the rotating part,
   wherein the fixing part extends from the extension part in a direction that crosses a direction of extension of the extension part, the fixing part being coupled to the rigid bar.

15. The electronic device of claim 14, wherein the rigid bar is fastened to the module cover by a first coupling member, and
   wherein the fixing part is fastened to the rigid bar by a second coupling member.

16. The electronic device of claim 12, further comprising a frame positioned behind the curved module cover such that the curved module cover is located between the curved plate and the frame,
   wherein the rigid bar is coupled to the frame.

17. The electronic device of claim 12, wherein the rigid bar includes a pair of reinforcing members extending away from a base portion, and
   wherein at least one of the reinforcing members of the pair of reinforcing members or the base portion includes a through hole to receive a fastener to connect the rigid bar to the curved module cover.

18. The electronic device of claim 1, wherein the curved display is rotatable between a first position where the curved display faces and covers the curved surface of the curved body and a second position where the curved display uncovers the curved surface.

19. The electronic device of claim 1, wherein the curved body has a bottom curved surface opposite the curved surface of the curved body.

20. The electronic device of claim 19, wherein the hinge is connected to the bottom curved surface.

* * * * *